United States Patent
Usui et al.

(10) Patent No.: US 8,599,460 B2
(45) Date of Patent: Dec. 3, 2013

(54) MICROMIRROR DEVICE AND MICROMIRROR ARRAY

(75) Inventors: Mitsuo Usui, Kanagawa (JP); Shingo Uchiyama, Kanagawa (JP); Fusao Shimokawa, Kanagawa (JP); Etsu Hashimoto, Kanagawa (JP); Johji Yamaguchi, Kanagawa (JP); Tohru Matsuura, Kanagawa (JP); Toshifumi Konishi, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 439 days.

(21) Appl. No.: 12/594,578

(22) PCT Filed: Apr. 15, 2008

(86) PCT No.: PCT/JP2008/057364
§ 371 (c)(1),
(2), (4) Date: Oct. 2, 2009

(87) PCT Pub. No.: WO2008/129988
PCT Pub. Date: Oct. 30, 2008

(65) Prior Publication Data
US 2010/0118372 A1 May 13, 2010

(30) Foreign Application Priority Data
Apr. 19, 2007 (JP) ................. 2007-110436

(51) Int. Cl.
G02B 26/08 (2006.01)
G02B 26/10 (2006.01)

(52) U.S. Cl.
USPC .................. 359/224.1; 359/221.1

(58) Field of Classification Search
USPC ........................................... 359/224.1
See application file for complete search history.

(56) References Cited

U.S. PATENT DOCUMENTS

| | | | |
|---|---|---|---|
| 6,747,786 B2 * | 6/2004 | Murakami et al. | 359/291 |
| 7,123,400 B2 * | 10/2006 | Murakami et al. | 359/298 |
| 2006/0082250 A1 * | 4/2006 | Ko et al. | 310/309 |
| 2006/0222312 A1 | 10/2006 | Mala et al. | |

FOREIGN PATENT DOCUMENTS

| | | |
|---|---|---|
| JP | 2003-057575 A | 2/2003 |
| JP | 2006-524349 A | 10/2006 |

* cited by examiner

*Primary Examiner* — Jade R Chwasz
(74) *Attorney, Agent, or Firm* — Blakely Sokoloff Taylor & Zafman

(57) ABSTRACT

A movable beam (182a) and a movable beam (182b) each having one end fixed to a frame portion (181) of a mirror substrate (108) are provided inside the frame portion (181). The movable beam (182a) and the movable beam (182b) each having one end fixed to a corresponding to one of two opposite inner sides of the frame portion (181) are aligned at a predetermined distance on the same line in the direction in which the two sides face each other. Each of the movable beam (182a) and the movable beam (182b) has the other end displaceable in the normal line direction of the mirror substrate (108) and therefore has a cantilever structure. A mirror (183) is arranged between the movable beam (182a) and the movable beam (182b) and connected to them via a pair of connectors (109a, 109b).

39 Claims, 16 Drawing Sheets

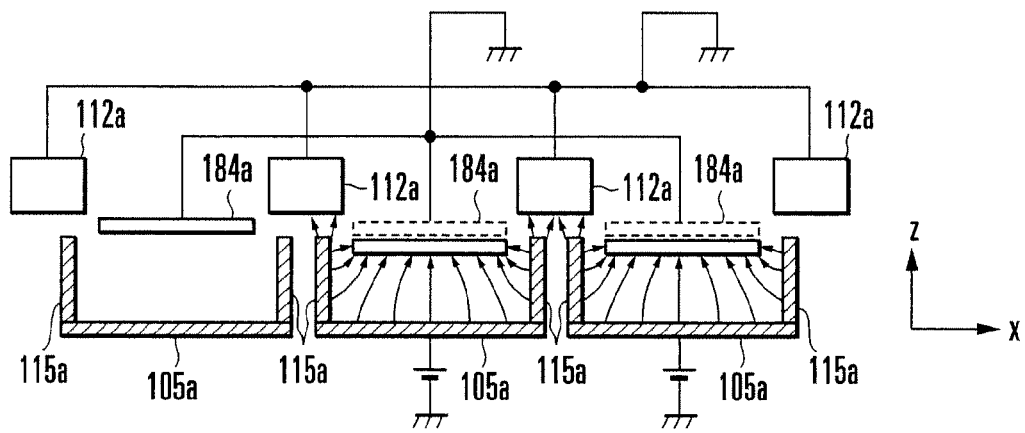
F I G. 23
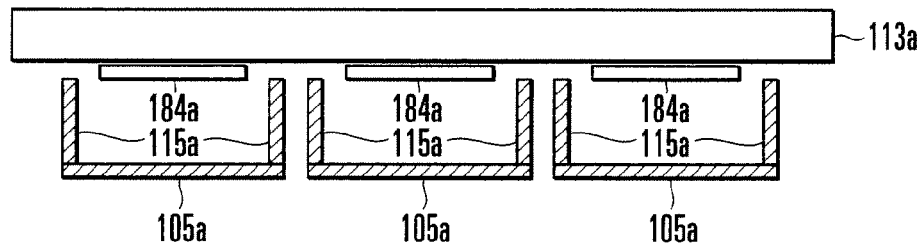
F I G. 24
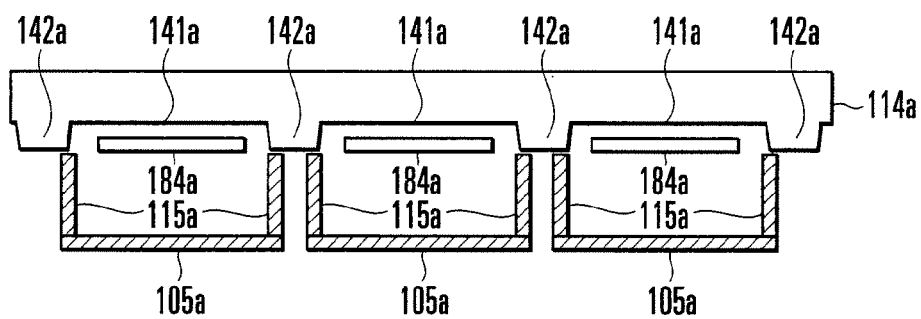
F I G. 25
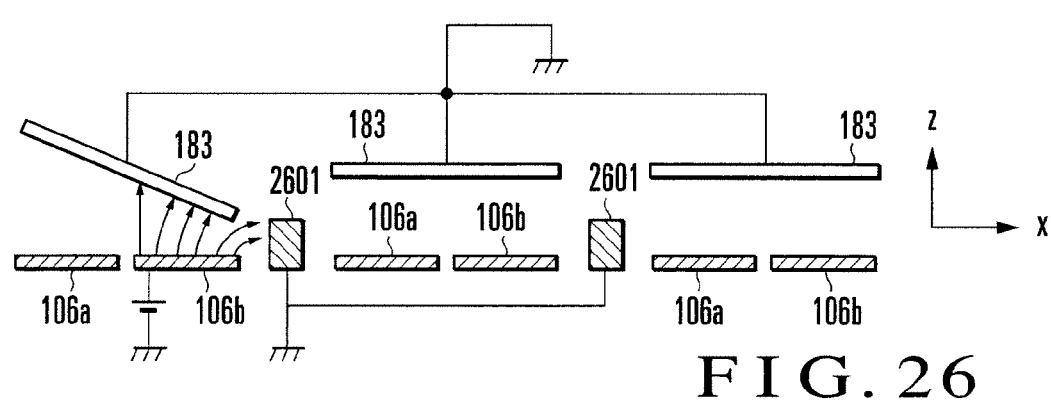
F I G. 26

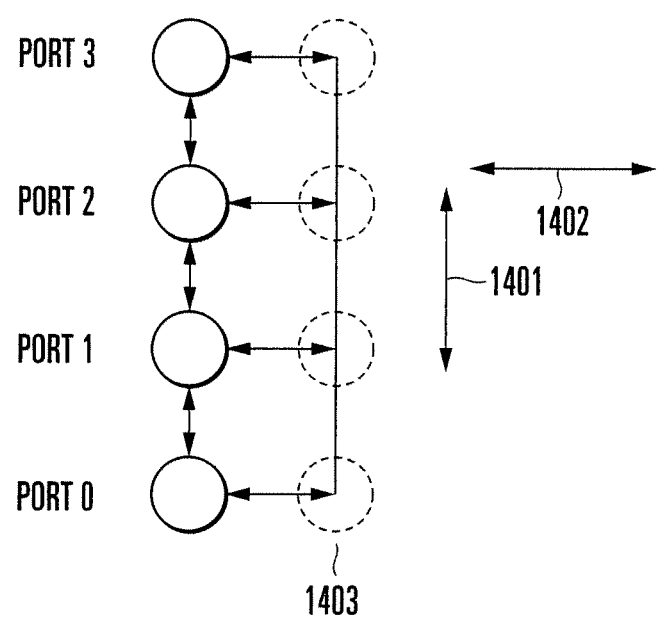
F I G. 31

MICROMIRROR DEVICE AND MICROMIRROR ARRAY

This is a non-provisional application claiming the benefit of International application number PCT/JP2008/057364 filed Apr. 15, 2008.

TECHNICAL FIELD

The present invention relates to a micromirror device and a micromirror array which are used in an optical switching device for communication, a measuring device, a display, a scanner, a wavelength selective switch, or the like.

BACKGROUND ART

In the field of an optical network that is the basis of an Internet communication network, the optical MEMS (Micro Electro Mechanical Systems) technique is moving into the limelight as a technique of implementing multi-channel, WDM (Wavelength Division Multiplexing), and cost reduction, and an optical switch using the optical MEMS technique has been developed (reference 1: Japanese Patent Laid-Open No. 2003-057575). The most characteristic component of the MEMS optical switch is a micromirror array formed by arraying a plurality of micromirror devices.

An optical switch enables path switching without converting light into an electrical signal. Use of the optical switch also makes it possible to switch the path without demultiplexing multiplexed light into wavelengths. Such an optical switch is used to, e.g., upon failure occurrence in a use path, distribute a signal to another path and maintain a communicable state.

In recent years, research and development of wavelength selective switches is in progress, which demultiplex multiplexed light into wavelengths and individually select the paths of light of the respective wavelengths. These wavelength selective switches also use micromirror devices.

A micromirror device (micromirror array) disclosed in reference 1 will be explained below with reference to FIGS. 29 and 30. The micromirror array includes a mirror substrate and an electrode substrate facing it. The mirror substrate has a plurality of movable structures acting as a mirror, and a support member which rotationally supports the movable structures via spring members such as torsion springs. For the electrode substrate, a plurality of electrode portions corresponding to the movable structures acting as a mirror are formed on a substrate serving as a base.

FIG. 29 is a perspective view schematically showing the arrangements of a mirror substrate and an electrode substrate. FIG. 30 is a sectional view schematically showing the arrangement of a micromirror device. Note that FIGS. 29 and 30 partially illustrate a micromirror device which is mainly one constituent unit of a micromirror array. A micromirror array is formed by one- or two-dimensionally arraying the micromirror devices shown in FIGS. 29 and 30. Each micromirror device includes a mirror substrate 200 having a mirror, and an electrode substrate 300 having electrodes. The mirror substrate 200 and the electrode substrate 300 are arranged in parallel to each other.

The mirror substrate 200 includes a plate-shaped base portion 210, a ring-shaped gimbal 220, and a disc-shaped mirror 230. The base portion 210 has an opening having an almost circular shape viewed from above. The gimbal 220 is arranged in the opening of the base portion 210 and connected to the base portion 210 via a pair of connectors 211a and 211b. The gimbal 220 also has an opening having an almost circular shape viewed from above. The mirror 230 is arranged in the opening of the gimbal 220 and connected to the gimbal 220 via a pair of mirror connectors 221a and 221b. A frame portion 240 is formed around the base portion 210 to surround the gimbal 220 and the mirror 230. The frame portion 240 is fixed to the base portion 210 via an insulating layer 250.

The connectors 211a and 211b are provided in the notches of the gimbal 220. The connectors 211a and 211b are formed from meander-shaped torsion springs and connect the base portion 210 to the gimbal 220. The gimbal 220 thus connected to the base portion 210 can rotate about a rotation axis (gimbal rotation axis) which passes through the connectors 211a and 211b. The mirror connectors 221a and 221b are provided in the notches of the gimbal 220. The mirror connectors 221a and 221b are formed from meander-shaped torsion springs and connect the gimbal 220 to the mirror 230. The mirror 230 thus connected to the gimbal 220 can rotate about a rotation axis (mirror rotation axis) which passes through the mirror connectors 221a and 221b. Note that the gimbal rotation axis and the mirror rotation axis are perpendicular to each other.

On the other hand, the electrode substrate 300 includes a plate-shaped base portion 310, a projecting portion 320 which projects from the upper surface of the base portion 310, and a pair of convex portions 360a and 360b which are formed at the periphery of the projecting portion 320 to be juxtaposed while sandwiching the projecting portion 320. The projecting portion 320 includes a second terrace 322 having a truncated pyramidal shape, a first terrace 321 having a truncated pyramidal shape and formed on the upper surface of the second terrace 322, and a pivot 330 having a truncated pyramidal shape and formed on the upper surface of the first terrace 321. The pivot 330 is arranged in correspondence with the central portion of the mirror 230.

Fan-shaped electrodes 340a, 340b, 340c, and 340d are formed on the upper surface of the electrode substrate 300 including the outer surface of the projecting portion 320 so as to be located in a circle concentric to the mirror 230 of the opposite mirror substrate 200. Electrical interconnections 370 are formed inside the convex portions 360a and 360b at the periphery of the projecting portion 320 on the electrode substrate 300. The electrodes 340a to 340d are connected to the electrical interconnections 370 via leads 341a to 341d. The electrodes and the electrical interconnections are formed on an insulating layer 311 which is formed on the surface of the electrode substrate 300.

In the mirror substrate 200 and the electrode substrate 300 which have the above-described arrangements, the mirror 230 faces the corresponding electrodes 340a to 340d. Additionally, the lower surface of the base portion 210 is bonded to the upper surfaces of the convex portions 360a and 360b of the base portion 310 via the insulating layer 311, thereby forming the micromirror device shown in FIG. 30.

In this micromirror device, the mirror 230 is grounded, and positive or negative voltages are applied to the electrodes 340a to 340d to generate an asymmetrical potential difference between them. This allows to attract the mirror 230 by an electrostatic attraction and make it rotate in an arbitrary direction. When forming, e.g., a 1-input 2-output optical switch using the micromirror device, the tilt angle of the mirror 230 is controlled to irradiate the mirror 230 with an optical signal from the input port and make the light reflected by the mirror 230 incident on one of the two output ports.

DISCLOSURE OF INVENTION

Problem to be Solved by the Invention

In the conventional micromirror device shown in FIGS. 29 and 30, for example, two pairs of almost fixed points are provided at the connection points between the mirror 230 and the mirror connectors 221a and 221b and between the gimbal 220 and the connectors 211a and 211b. The axes that connect the two pairs of almost fixed points serve as the mirror rotation axis and the gimbal rotation axis to make the mirror 230 rotate in two different directions. Hence, when using the above-described conventional micromirror device, adjacent mirrors need to be spaced apart at a distance corresponding to the size of the connectors that form the rotation axes.

To switch the paths of light of respective wavelengths which are obtained by causing a grating or the like to demultiplex a multiplexed optical signal in a uniaxial direction, as in a wavelength selective switch, it is necessary to use a micromirror array which is formed by one-dimensionally arraying micromirror devices capable of rotating in two different directions while reducing the interval between adjacent mirrors to a predetermined value or less. If the interval between the mirrors increases relative to the interval of the paths of demultiplexed light of the respective wavelengths, light strikes a region between the mirrors. This makes it impossible to guide light of a wavelength concerned to an output port. For example, to cause a wavelength selective switch to switch optical signals demultiplexed by a grating and having a relatively narrow wavelength interval, the central interval between the arrayed mirrors is required to be as narrow as about 100 μm. Depending on required specifications about the passbands of optical signals, the array-direction width of each mirror is sometimes required to be 80% or more of the central interval of the mirrors. In this case, the interval between the adjacent mirrors is required to be 20 μm or less.

Hence, in, e.g., a wavelength selective switch which switches the paths of light of the respective wavelengths demultiplexed using a grating or the like, the above-described mirror's two-axis rotation operation needs to be performed in a situation wherein the interval between the adjacent mirrors is 20 μm or less. In the conventional micromirror device shown in FIGS. 29 and 30, however, the mirrors need to be spaced apart in the direction of each rotation axis at a distance corresponding to the size of the connectors. When the two-axis rotation operation is enabled, it is impossible to meet the above-described requirement of a narrow mirror interval.

The present invention has been made to solve the above-described problem, and has as its object to enable the mirror's two-axis rotation operation even in a situation wherein the interval between adjacent mirrors is narrower.

Means of Solution to the Problem

According to the present invention, there is provided a micromirror device comprising a reflecting portion and an electrode portion facing the reflecting portion, the reflecting portion comprising at least a first movable beam and a second movable beam each having one end fixed and the other end displaceable, the first movable beam and the second movable beam being arranged in a line at a predetermined distance while the other end of the first movable beam faces the other end of the second movable beam, a mirror which is arrayed in a line with the first movable beam and the second movable beam and rotationally arranged between the first movable beam and the second movable beam, and for example, a pair of a first flexible connector and a second flexible connector each of which connects the other end of a corresponding one of the first movable beam and the second movable beam to the mirror, and the electrode portion comprising at least a driving electrode for first movable beam which faces the first movable beam at a predetermined distance, a driving electrode for second movable beam which faces the second movable beam at a predetermined distance, and mirror driving electrodes which face the mirror at a predetermined distance. The mirror rotates about two rotation axes by the displacement operation of the first movable beam and the second movable beam.

According to the present invention, there is also provided a micromirror array including a plurality of micromirror devices arrayed, the micromirror device comprising a reflecting portion and an electrode portion facing the reflecting portion, the reflecting portion comprising at least a first movable beam and a second movable beam each having one end fixed and the other end displaceable, the first movable beam and the second movable beam being arranged in a line at a predetermined distance while the other end of the first movable beam faces the other end of the second movable beam, a mirror which is arrayed in a line with the first movable beam and the second movable beam and rotationally arranged between the first movable beam and the second movable beam, and a pair of a first connector and a second connector each of which connects the other end of a corresponding one of the first movable beam and the second movable beam to the mirror, the electrode portion comprising at least a driving electrode for first movable beam which faces the first movable beam at a predetermined distance, a driving electrode for second movable beam which faces the second movable beam at a predetermined distance, and mirror driving electrodes which face the mirror at a predetermined distance, and the micromirror devices being arrayed along a direction perpendicular to an array direction of the first movable beam and the second movable beam.

Effect of the Invention

As described above, according to the present invention, the first movable beam and the second movable beam which are connected to the mirror via the pair of the first connector and the second connector are provided. The displacement operation of the first movable beam and the second movable beam allows the mirror to rotate about the two rotation axes. It is therefore possible to obtain an excellent effect of enabling the two-axis rotation operation of the mirror even when the interval between adjacent mirrors is narrower.

BRIEF DESCRIPTION OF DRAWINGS

FIG. 23 is a schematic sectional view for explaining crosstalk;

FIG. 24 is a sectional view showing another example of the arrangement of an upper inter-device electrode of the micromirror device (micromirror array) according to the third embodiment of the present invention;

FIG. 25 is a sectional view showing still another example of the arrangement of the upper inter-device electrode of the micromirror device (micromirror array) according to the third embodiment of the present invention;

FIG. 26 is a schematic sectional view for explaining an example of the arrangement of an inter-device electrode wall of the micromirror device (micromirror array) according to the third embodiment of the present invention;

FIG. 31 is a view for explaining a port switching operation.

BEST MODE FOR CARRYING OUT THE INVENTION

The embodiments of the present invention will now be described with reference to the accompanying drawings.

[First Embodiment]

Figure 1A:
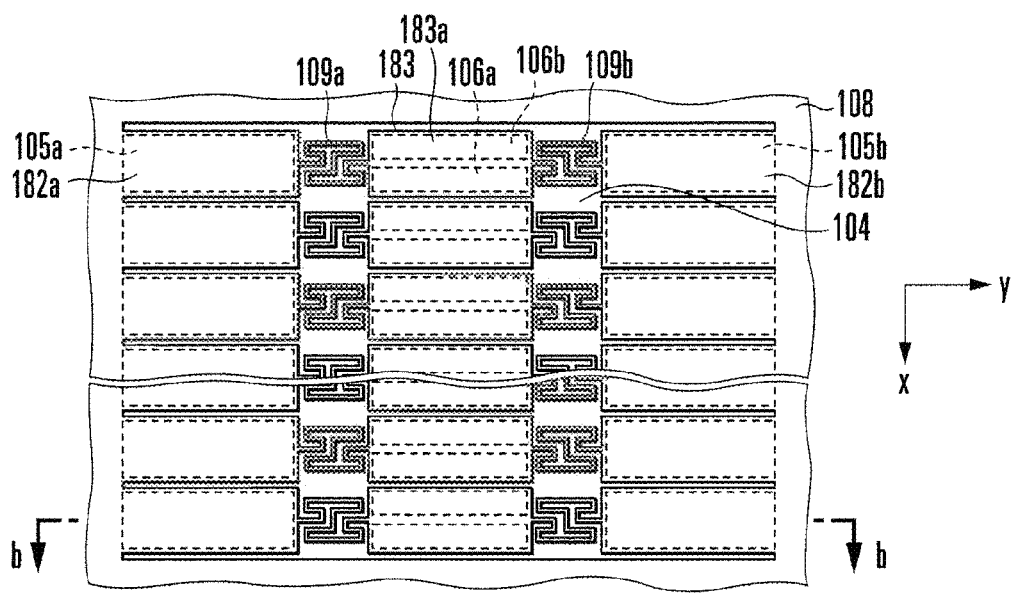
FIG. 1A is a plan view showing an example of the arrangement of micromirror devices (micromirror array) according to the first embodiment of the present invention.
Figure 1B:
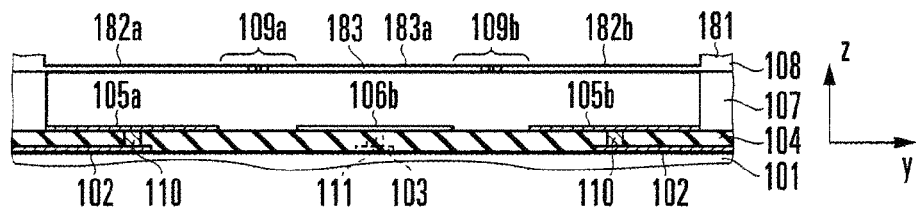
FIG. 1B is a sectional view showing an example of the arrangement of the micromirror device (micromirror array) according to the first embodiment of the present invention.
Figure 1C:
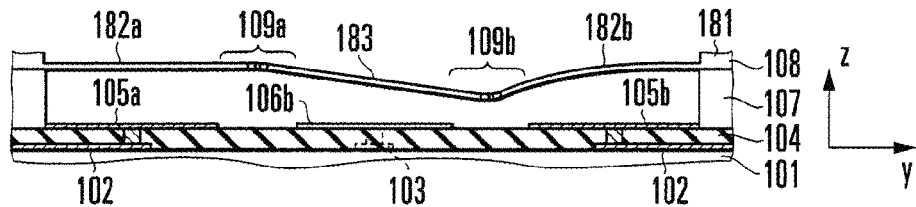
FIG. 1C is a sectional view showing an example of the arrangement of the micromirror device (micromirror array) according to the first embodiment of the present invention.
Figure 1D:
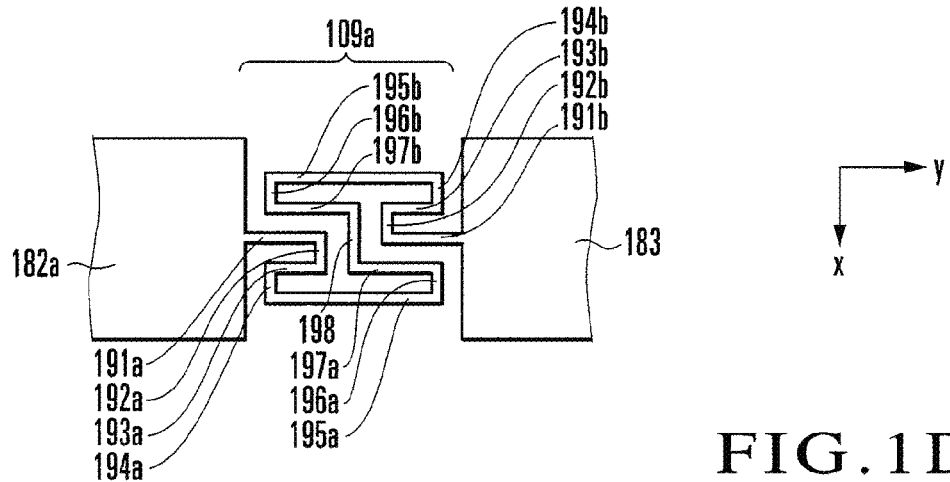
FIG. 1D is a partially enlarged plan view showing an example of the arrangement of the micromirror device (micromirror array) according to the first embodiment of the present invention.

The first embodiment of the present invention will be described first with reference to FIGS. 1A to 1D. FIG. 1A is a plan view showing an example of the arrangement of micromirror devices according to the first embodiment. FIGS. 1B and 1C are sectional views showing an example of the arrangement of the micromirror device according to the first embodiment. FIG. 1D is a partially enlarged plan view showing an example of the arrangement of the micromirror device according to the first embodiment. FIG. 1A illustrates a micromirror array formed by arraying a plurality of micromirror devices in the vertical direction (x direction) of the drawing surface.

A micromirror device according to the first embodiment includes, e.g., an electrode substrate 101 and a mirror substrate 108 facing it. A support structure 107 provided to surround a micromirror array region including the plurality of micromirror devices fixes the mirror substrate 108 above the electrode substrate 101 at a predetermined distance. The electrode substrate 101 and the mirror substrate 108 are arranged in parallel to each other.

An electrical interconnection layer including electrical interconnections 102 and 103, and an interlayer dielectric film 104 covering the electrical interconnection layer are formed on the electrode substrate 101 made of single-crystal silicon. In correspondence with each micromirror device, movable beam driving electrodes 105a and 105b and mirror driving electrodes 106a and 106b are provided on the interlayer dielectric film 104 on the electrode substrate 101. The movable beam driving electrodes 105a and 105b and mirror driving electrodes 106a and 106b constitute one electrode portion (one electrode portion group).

The movable beam driving electrodes 105a and 105b are connected to some of the electrical interconnections 102 via through electrodes 110 which extend through the interlayer dielectric film 104. The mirror driving electrodes 106a and 106b are connected some of the electrical interconnections 103 via through electrodes 111 which extend through the interlayer dielectric film 104. Note that in the above description, the electrical interconnections are arranged while ensuring interlayer isolation by the interlayer dielectric film 104. However, the present invention is not limited to this. The electrical interconnections may be provided on the electrode formation surfaces.

The mirror substrate 108 includes a frame portion 181 having an opening to expose the micromirror array region. The frame portion 181 is connected to the support structure 107. Movable beams 182a and 182b each having one end fixed to the frame portion 181 are provided inside the frame portion 181 of the mirror substrate 108. One end of each of the movable beams 182a and 182b is fixed to a corresponding one of the two opposite internal sides of the frame portion 181. Hence, the movable beams 182a and 182b are aligned at a predetermined distance on the same line in the direction in which the two sides face each other. That is, the movable beams 182a and 182b each having one end fixed and the other end facing that of the counterpart are arranged in line at a predetermined distance. In the example shown in FIG. 1A, the movable beams 182a and 182b are aligned on a line parallel to the y-axis direction. Additionally, each of the movable beams 182a and 182b has the other end displaceable in the normal line direction of the mirror substrate 108 and therefore has a cantilever structure.

A mirror 183 is arranged between the movable beams 182a and 182b and connected to them via a pair of flexible connectors 109a and 109b. The mirror 183 is aligned with the movable beams 182a and 182b and rotationally arranged between them. The connectors 109a and 109b connect the other end of each of the movable beams 182a and 182b to the mirror 183. The movable beam 182a, the mirror 183, and the movable beam 182b are aligned in this order on the same line in the direction in which the two sides connected to the movable beams 182a and 182b face each other. The movable beam 182a, the mirror 183, the movable beam 182b, and the pair of connectors 109a and 109b form one reflecting portion (one reflecting portion group).

In the example shown in FIGS. 1A, 1B, and 1C, the movable beam 182a, the mirror 183, and the movable beam 182b are aligned on a line parallel to the y-axis direction. The mirror 183 can rotate about a first rotation axis which passes through the pair of connectors 109a and 109b. In the example shown in FIGS. 1A, 1B, and 1C, the mirror 183 can rotate about the first rotation axis parallel to the y-axis direction. In FIG. 1A, a plurality of micromirror devices are arranged along a direction perpendicular to the alignment (array) direction of the movable beam 182a, the mirror 183, and the movable beam 182b, thereby forming a micromirror array. Note that a reflecting film 183a of, e.g., gold or aluminum is formed on the surface of the mirror 183 to reflect, for example, light in the infrared region.

The above-described movable beam driving electrodes 105a and 105b and the set of the mirror driving electrodes 106a and 106b, the movable beam 182a, the mirror 183, the movable beam 182b, which are paired with the electrodes, and the pair of connectors 109a and 109b form one micromirror device. In one micromirror device, the movable beam driving electrode 105a and the movable beam 182a are arranged while facing each other in the normal line direction (z-axis direction) of the electrode substrate 101 (mirror substrate 108), and so are the movable beam driving electrode 105b and the movable beam 182b, and the set of mirror driving electrodes 106a and 106b and the mirror 183.

Driving voltages (driving signals) to drive the movable beams 182a and 182b are applied to the movable beam driving electrodes 105a and 105b via the electrical interconnections 102. Driving voltages to drive the mirror 183 are applied to the mirror driving electrodes 106a and 106b via the electrical interconnections 103. Note that the electrical interconnection 102 connected to the movable beam driving electrode 105a is different from the electrical interconnection 102 connected to the movable beam driving electrode 105b, although they are simply illustrated in the drawings. Similarly, the electrical interconnection 103 connected to the mirror driving electrode 106a is different from the electrical interconnection 103 connected to the mirror driving electrode 106b. This enables to apply different arbitrary driving voltages. Note that the movable beam 182a, the mirror 183, the movable beam 182b, and the pair of connectors 109a and 109b are set at an equipotential. The equipotential is, for example, the ground potential.

The micromirror device according to the above-described first embodiment is formed by bonding the electrode substrate 101 and the mirror substrate 108 via the support structure 107. The mirror substrate 108 can be formed from, e.g., an SOI (Silicon On Insulator) substrate. The SOI substrate has a thin silicon layer (SOI layer) on a buried insulating layer formed on a thick silicon substrate portion. Plate-shaped structures such as the frame portion 181, the movable beams 182a and 182b, the connectors 109a and 109b, and the mirror 183 can be formed by processing the SOI layer. After processing these structures, the substrate portion, the buried insulating layer, and the like are removed. The reflecting film 183a is formed by depositing a desired metal by, e.g., sputtering or vapor deposition.

On the other hand, the electrode substrate 101 can be formed using a well-known method of manufacturing a semiconductor device such as an LSI integrated circuit. Alternatively, an electrode substrate having the support structure 107 may be formed by etching, in an alkali solution such as a potassium hydroxide solution, a single-crystal silicon substrate having a (100) plane as a major surface in terms of crystal orientation, and forming a concave portion having a predetermined depth in the silicon substrate. As is well known, the etching rate of the (111) plane of single-crystal silicon in alkali is considerably lower than that of the (100) or (110) plane. Use of this phenomenon makes it possible to form a support structure having a truncated pyramidal shape.

Note that a separately prepared support structure may be used. For example, a support structure formed by solder bumps or plating may be used. Alternatively, an integrated circuit including a plurality of elements connected to the electrical interconnections 102 and 103 may be provided on the electrode substrate 101 to form a control circuit for controlling driving voltages to be applied to the electrodes. Otherwise, the mirror portion and the electrode portion may integrally be built up by surface micromachining.

The operation of the micromirror device will be described next. First, a predetermined driving voltage is applied to the movable beam driving electrode 105b to generate an electrostatic attraction and thus attract the movable beam 182b toward the electrode substrate 101. The movable beam 182b bends (deforms) using its end supported by the frame portion 181 as a fulcrum so that the other end of the movable beam 182b displaces toward the electrode substrate 101, as shown in FIG. 1C. Consequently, the mirror 183 is attracted toward the electrode substrate 101 on the side of the connector 109b using the connector 109a as a fulcrum. The mirror 183 is not parallel to the electrode substrate 101 any longer but tilts in the y-axis direction. Note that FIG. 1B illustrates the initial state before voltage application to the electrodes.

Figure 3A:
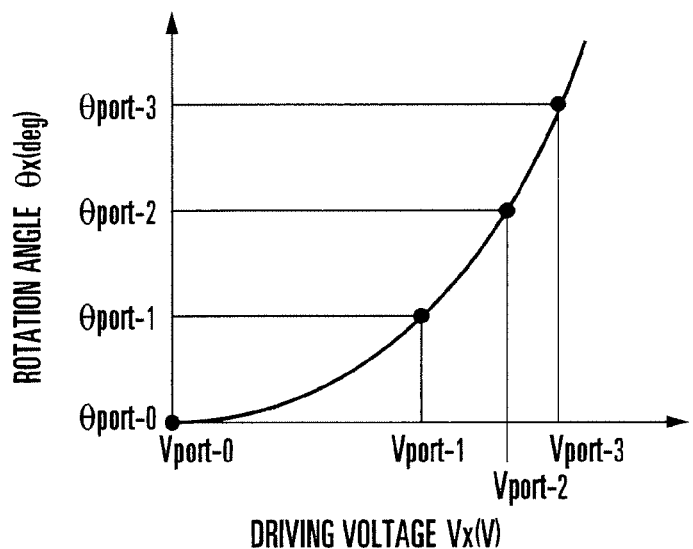
FIGS. 3A and 3B are views for explaining a case in which the projection destination of light reflected by a mirror 183 is switched among a plurality of ports arrayed at an equidistance.
Figure 3B:
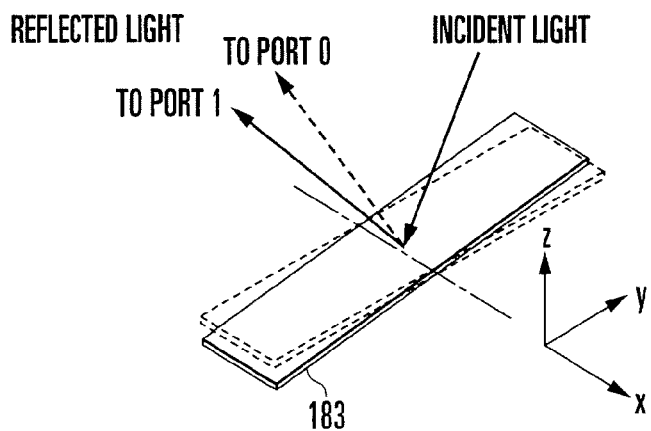

In the state shown in FIG. 1C, the mirror 183 rotates about the second rotation axis which passes through the central portion of the mirror 183 and is parallel to the micromirror device array direction (x-axis direction). The mirror can perform this rotation operation even by applying a predetermined driving voltage to the movable beam driving electrode 105a to attract the other end of the movable beam 182a toward the electrode substrate 101 in the same way as described above. In this case, the mirror 183 rotates about the second rotation axis in a direction opposite to that in the above-described case. A case will be explained in which, for example, the projection destination of light reflected by the mirror 183 is switched among a plurality of ports arrayed at an equidistance, as shown in FIG. 3I. In this case, the driving voltage applied to the movable beam driving electrode 105a is changed as shown in FIG. 3A, thereby controlling the rotation angle of the pivot operation of the mirror 183 about the second rotation axis, as shown in the perspective view of FIG. 3B.

The rotation angle of the mirror 183 about the second rotation axis is decided based on the relationship between the y-axis direction length between the portions of the connectors 109a and 109b connected to the two ends of the mirror 183 and the subsidence amount of the central portion of the connector 109a or 109b when the movable beam 182a or 182b is attracted toward the electrode substrate 101. For example, when the length between the central portions of the connectors 109a and 109b is 500 µm, and the subsidence amount is 13 µm, a rotation angle θ of the mirror 183 is $\theta=\tan-1(13/500)\approx 1.5°$. The subsidence amount is decided by the balance between an electrostatic attraction generated upon driving voltage application to the movable beam driving electrode 105a or 105b and a repulsive force defined by the z-axis direction spring constant of the movable beam 182a or 182b. To more largely rotate the mirror 183 by a less electrostatic attraction, it is effective to increase the areas of the movable beam driving electrodes and the movable beams. If the width (x-axis direction) is constant, it is effective to increase the length (y-axis direction). For example, the ratio of the length between the central portions of the pair of connectors 109a and 109b to the length of the movable beam 182a or 182b is preferably approximately 2:1.

The above-described rotation about the second rotation axis is done while moving the second rotation axis in the z-axis direction. However, displacing the movable beams 182a and 182b to different sides in the z-axis direction allows the mirror 183 to rotate about the second rotation axis without moving it. For example, predetermined bias voltages are applied to the movable beam driving electrodes 105a and 105b, and then, the driving voltages applied to them are controlled, thereby displacing the movable beams 182a and 182b to different sides in the z-axis direction.

Figure 2:
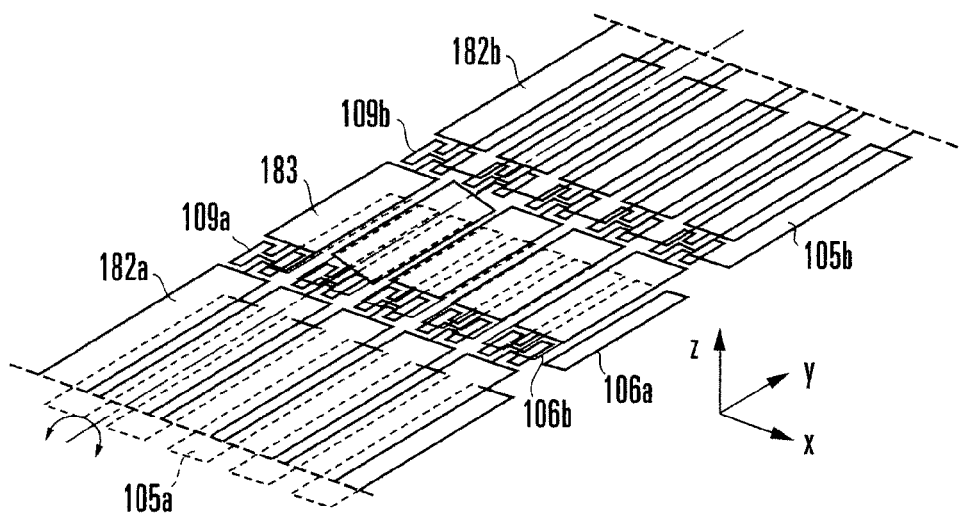
FIG. 2 is a perspective view showing an example of the arrangement of the micromirror devices (micromirror array) according to the first embodiment of the present invention.

Controlling voltages applied to the mirror driving electrodes 106a and 106b enables the mirror 183 to rotate about the first rotation axis which passes through the pair of connectors 109a and 109b, as shown in the perspective view of FIG. 2. For example, a higher voltage is applied to the mirror driving electrode 106b relative to the mirror driving electrode 106a. This allows control to tilt the mirror 183 toward the mirror driving electrode 106b about the first rotation axis. The conventional micromirror device is designed as an element using connectors as almost fixed ends. However, the micromirror device according to the first embodiment actively moves the pair of connectors 109a and 109b, thereby realizing two-axis rotation via them. Note that in the above description, the pair of mirror driving electrodes 106a and 106b are provided to be linearly symmetric with the first rotation axis. However, the present invention is not limited to this. It is also possible to make the mirror 183 rotate using only one mirror driving electrode. Hence, one mirror driving electrode suffices.

Figure 4:
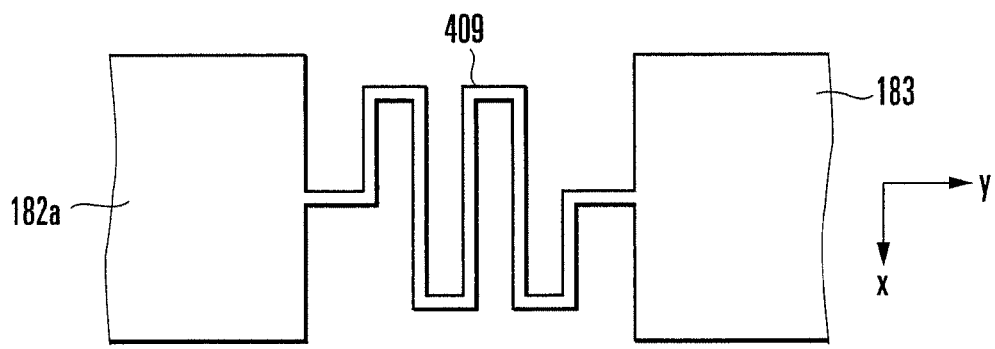
FIG. 4 is a plan view showing another example of the arrangement of the connector of the micromirror device (micromirror array) according to the first embodiment of the present invention.

Note that an electrostatic attraction drives the mirror 183. The deformed state, i.e., the rotation angle of the mirror is decided based on parameters including the distance between the reflecting portion and the electrode portion, the dielectric constant of a gas (air) that exists between them, the voltage applied across the reflecting portion and the electrode portion, and the areas and rigidities of structures such as the mirror and the movable beams. Hence, designing a micromirror device handles deciding the above-described parameters to meet required specifications. The materials, sizes, and shapes of the structures are appropriately decided in accordance with the required specifications. Especially, as for the shape of the connectors 109a and 109b, a meander-shaped structure shown in FIG. 4 is applicable in some cases. The connectors 109a and 109b may have another shape. For example, a connector which has, at the long portion (x-axis direction) of the meander-shaped structure, a plurality of bending portions with projections and recesses alternately arranged in a direction different from the running direction may be used (reference 2: Japanese Patent No. 3831346).

The connectors 109a and 109b will be described next. For example, the connector 109a has an almost rectangular section perpendicular to the x-axis direction or the y-axis direction. The connector 109a has a nearly H-like planar shape with almost rectangular parts formed symmetrically with respect to the rotation axis, as shown in the plan view of FIG. 1D. The connector 109a includes 15 parts 191a, 192a, 193a, 194a, 195a, 196a, 197a, 198, 191b, 192b, 193b, 194b, 195b, 196b, and 197b. The part 191a is connected to the movable beam 182a, and the part 191b is connected to one end of the mirror 183, thereby rotationally connecting the mirror 183 to the movable beam 182a.

Note that the direction in which the connector 109a connects one connection point to the other connection points will be referred to as "rotation axis direction" or "y-axis direction". The widthwise direction of the connector 109a, i.e., a direction perpendicular to the y-axis direction in a plane including the connector 109a will be referred to as "x-axis direction". The thickness direction of the connector 109a, i.e., a direction perpendicular to the y- and x-axis directions will be referred to as "z-axis direction". The direction in which the mirror 183 connected to the connector 109a rotates, i.e., a direction about the y-axis will be referred to as "rotation direction" or "R direction".

The planar shape of the connector 109a will be described in more detail. The connector 109a has a nearly H-like planar shape by continuously connecting the parts 191a to 197a, 191b to 197b, and 198, as shown in FIG. 1D. Each of the parts 191a to 191b has an almost rectangular beam-like planar shape and is arranged in the following manner. Note that the distance of each part indicates the length of a corresponding line segment of a line that expresses the connector 109a, i.e., the length of the center line of each part along the part connection direction.

The part 191a is formed to run by a distance L1 in the positive y-axis direction from one end connected to the movable beam 182a. The part 192a is formed to run by a distance L2 in the positive x-axis direction from one end connected to the other end of the part 191a. The part 193a is formed to run by a distance L3 (L1>L3) in the negative y-axis direction from one end connected to the other end of the part 192a. The part 194a is formed to run by the distance L2 in the positive x-axis direction from one end connected to the other end of the part 193a. The part 195a is formed to run by a distance L4 (L4>L3) in the positive y-axis direction from one end connected to the other end of the part 194a.

The part 196a is formed to run by the distance L2 in the negative x-axis direction from one end connected to the other end of the part 195a. The part 197a is formed to run by a distance L5 (L4>L5>L3, (L4−L3)>L5) in the negative y-axis direction from one end connected to the other end of the part 196a. The part 198 is formed to run by a distance L6 (L6≈2L2) in the negative x-axis direction from one end connected to the other end of the part 197a. The part 197b is formed to run by the distance L5 in the negative y-axis direction from one end connected to the other end of the part 198. The part 196b is formed to run by the distance L2 in the negative x-axis direction from one end connected to the other end of the part 197b.

The part 195b is formed to run by the distance L4 in the positive y-axis direction from one end connected to the part 196b. The part 194b is formed to run by the distance L2 in the positive x-axis direction from one end connected to the other end of the part 195b. The part 193b is formed to run by the distance L3 in the negative y-axis direction from one end connected to the other end of the part 194b. The part 192b is formed to run by the distance L2 in the positive x-axis direction from one end connected to the other end of the part 193b. The part 191b is formed to run by the distance L1 in the positive y-axis direction from one end connected to the other end of the part 192b.

The total length of the parts 191a, 193a, 195a, 197a, 197b, 195b, 193b, and 191b of the connector 109a formed in the y-axis direction is longer than the interval between the movable beam 182a and the mirror 183 (the total length of the connector 109a) in a no-load state and also longer than the total length of the parts 192a, 194a, 196a, 198, 196b, 194b, and 192b formed in the x-axis direction. The total length indicates a length obtained by connecting the parts in a line along the longitudinal direction, i.e., the y- or x-axis direction. Note that the parts 192a and 194a and the parts 194b and 192b are formed to have the same length. However, they may be formed in different lengths. Similarly, the parts 191a and 191b may also be formed in different lengths.

The lengths of the parts 191a to 191b can freely be set as needed by, e.g., forming all parts in different lengths and shifting the axis of the part 191a from that of the part 191b as far as the parts formed in parallel are spaced apart from each other. Hence, at least the parts 191a and 197b, the parts 192a and 198, the parts 197a and 191b, and the parts 198 and 192b are formed to be spaced apart from each other.

Examples of parameters that decide the characteristics such as the spring constant of the connector 109a having the above-described shape are the total length and width of the connector 109a, the total length of the parts formed in parallel to the y-axis direction, the total length of the parts formed in parallel to the x-axis direction, and the thickness of the connector 109a. The parameters also include the interval between the parts parallel to the y-axis and the ratio of the length of a part (part 195a or 195b) parallel to the y-axis direction with respect to the total length.

According to the connectors 109a and 109b having the above-described nearly H-like planar shape, when setting a small spring constant in the R direction, the spring constant in each axial direction can be made larger as compared to a connector having a meander shape. This is because the spring constant of the connector in the R direction greatly depends on the length of the parts formed in the rotation axis direction, i.e., the y-axis direction. The parts formed in the y-axis direction correspond to, e.g., the parts 191a, 193a, 195a, 197a, 197b, 195b, 193b, and 191b in FIG. 1D.

In a microstructure such as a MEMS, the value of the spring constant in the R direction results more largely from the torsion of the connector than from its bending. For this reason, a connector which is assumed to bend to make the mirror rotate, like the conventional connector having a meander shape, cannot make the spring constant in the R direction small while keeping a large spring constant in each axial direction by extending the folded portions and the like. Additionally, the y-axis direction length of the conventional connector having a meander shape is limited, i.e., cannot exceed the length of the entire connector. It is therefore difficult to freely set the spring constant in the R direction within a wide range as needed.

To the contrary, the almost H-shaped connectors 109a and 109b which turn a plurality of number of times in the y-axis direction readily twist about the y-axis, i.e., have a small spring constant in the R direction because the parts in the y-axis direction are long. This makes it possible to freely set the spring constant in the R direction within a wide range as needed without making the spring constants in the x-, y-, and z-axis directions smaller than in the connector having a meander shape. Especially, it is possible to set a larger spring constant in each axial direction and freely set the spring constant in the R direction within a wide range as needed by making the total length of the parts having axes parallel to the y-axis direction of the connectors 109a and 109b larger than the total length of the parts having axes parallel to the x-axis direction.

The connectors 109a and 109b having a nearly H-like planar shape can include more parts parallel to the y-axis direction within the limited space in the x-axis direction and therefore cause torsions about more axes. This enables to make the spring constant in the R direction smaller. Note that use of the connectors having a nearly H-like planar shape facilitates control of the spring constant in the R direction. However, a torsion spring having a meander shape may be used as a connector 409, as shown in FIG. 4, as a matter of course.

Note that in the above description, a plurality of micromirror devices are arrayed at an equidistance. However, the present invention is not limited to this. For example, if each optical signal as the path switching target is demultiplexed at a predetermined frequency interval, the micromirror devices (mirrors 183) have not a predetermined interval but intervals calculated by formulas related to the frequencies of the optical signals. To the contrary, if optical signals as the path switching target are demultiplexed at a predetermined wavelength interval, the micromirror devices (mirrors 183) generally have a predetermined interval.

The width (x-axis direction) and length (y-axis direction) of each mirror 183 and the x-axis direction array interval of the mirrors 183 are decided based on the wavelength interval of optical signals as the path switching target, the passband or transmission band of each optical signal, and the specifications and design of the beam of each optical signal. For example, to set the frequency interval of optical signals to 100 GHz and the passband (0.5 dB bandwidth) to 60 GHz when the beam radius on the mirror 183 is 20 μm, the x-axis direction array interval of the mirrors 183 is set to 100 μm, and the width is set to 85 μm.

Figure 5:
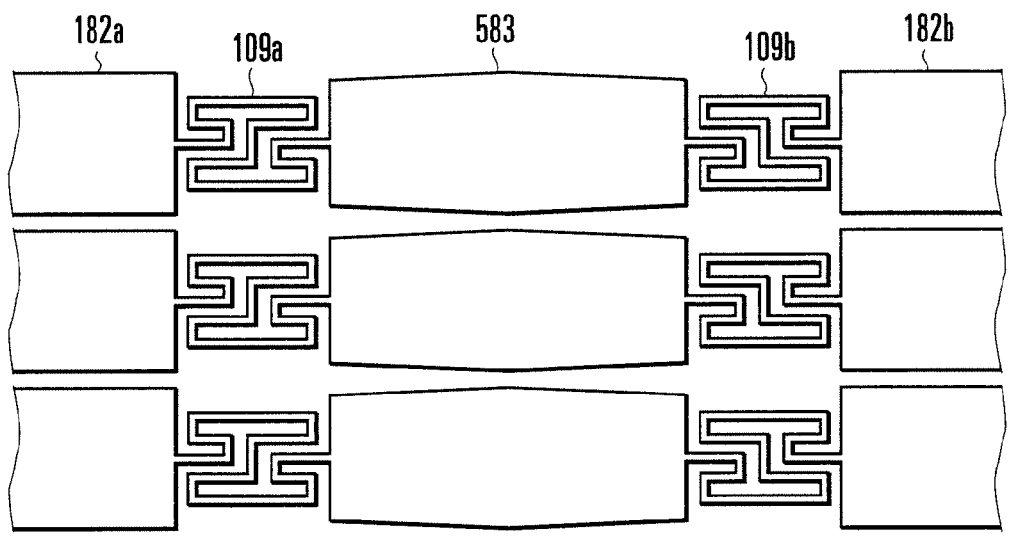
FIG. 5 is a plan view showing another example of the arrangement of the micromirror devices (micromirror array) according to the first embodiment of the present invention.

In the above description, the mirror 183 is rectangular when viewed from above. However, the present invention is not limited to this. For example, the opposite sides (side surfaces) of the mirror 183 in the micromirror device array direction may be projected toward the adjacent micromirror devices to form a mirror 583, as shown in the plan view of FIG. 5. In other words, the planar shape of the mirror 583 narrows toward the connectors 109a and 109b. The mirror 583 is hexagonal in the example shown in FIG. 5.

This makes it possible to reduce the narrow region between adjacent mirrors and easily suppress locking of the mirrors without causing demultiplexed light of the respective wavelengths to strike the region between the mirrors. The demultiplexed light of each wavelength is a circular or elliptic beam. Hence, the above-described mirror shape can decrease beam loss caused by vignetting between the adjacent mirrors when reflecting a beam at the center of the mirror. In addition, since the distance between the adjacent mirrors is minimized almost at one point, the structure including the mirrors spaced apart from each other can easily be formed in the manufacture.

Figure 6:
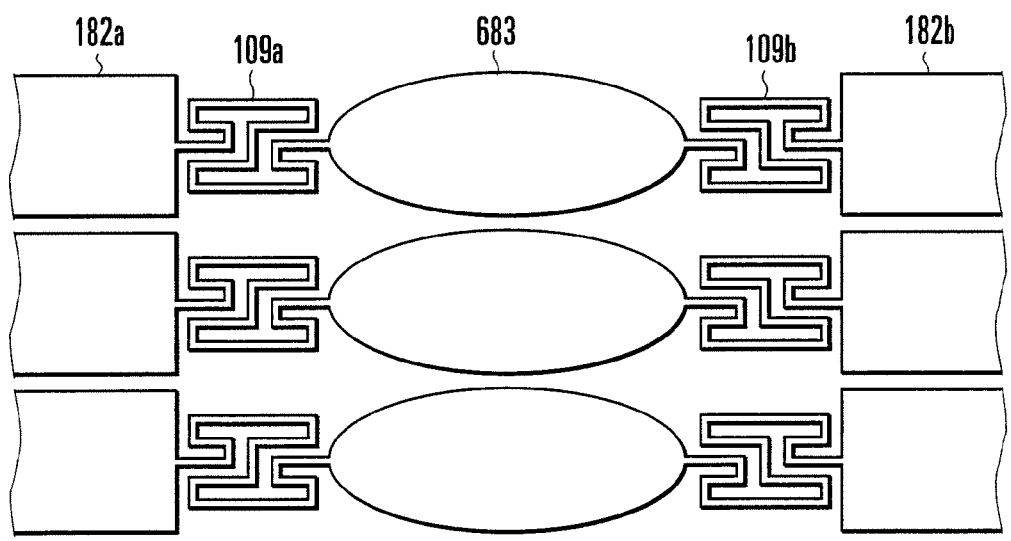
FIG. 6 is a plan view showing still another example of the arrangement of the micromirror devices (micromirror array) according to the first embodiment of the present invention.

Also usable is a mirror 683 having an elliptic planar shape with a major axis being arranged on the first rotation axis that passes through the pair of connectors 109a and 109b, as shown in the plan view of FIG. 6. The elliptic shape also easily suppresses locking of the mirrors, as described above. Additionally, the elliptic shape without angles can suppress contact between the rotating mirror and the electrode portion, resulting in a wider rotation range.

In actual use, if an excess voltage is applied to a driving electrode to generate an electrostatic attraction (driving force) larger than the restoring force of the movable beam or the connector during the above-described rotate about the first and second rotation axes, the distal end of the movable beam or the mirror on the connector side comes into contact (collision) with the driving electrode. That is, a pull-in phenomenon occurs. For example, such a pull-in phenomenon (contact) may fuse and stick the distal end of the mirror to the electrode or stick the movable beam and the electrode. This disables the optical signal switching operation.

Figure 7A:
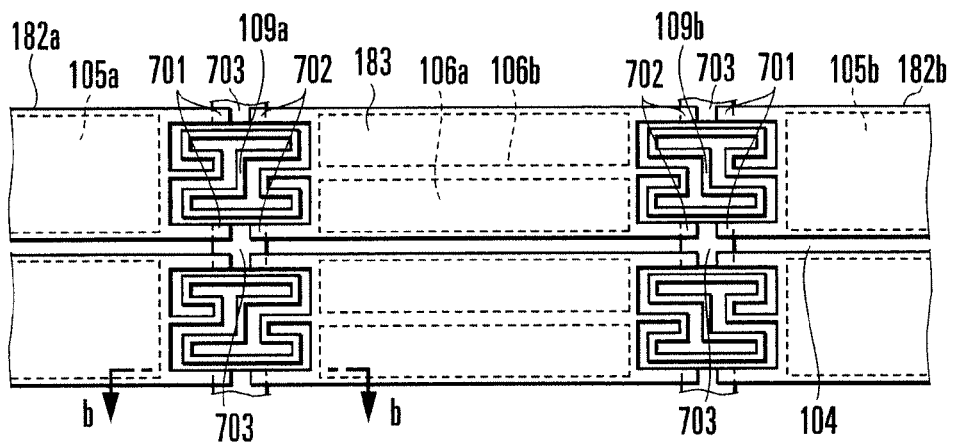
FIG. 7A is a plan view showing still another example of the arrangement of the micromirror devices (micromirror array) according to the first embodiment of the present invention.
Figure 7B:
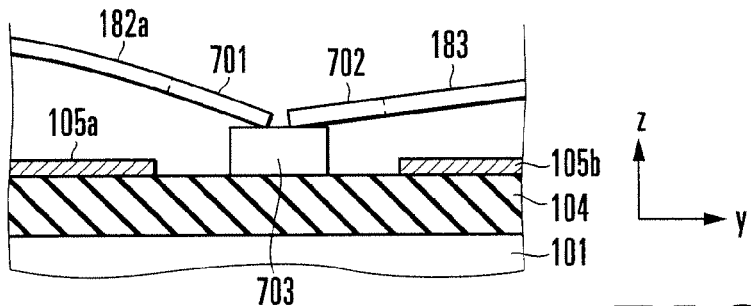
FIG. 7B is a partial sectional view showing still another example of the arrangement of the micromirror device (micromirror array) according to the first embodiment of the present invention.

To avoid the above-described problem, for example, as shown in FIGS. 7A and 7B, movable beam extending portions 701 are provided for the movable beams 182a and 182b on the sides of the connectors 109a and 109b so as to run and surround the connectors. In addition, mirror extending portions 702 are provided for the mirror 183 on the sides of the connectors 109a and 109b so as to run and surround the connectors. Furthermore, support portions 703 are provided on the electrode substrate 101 (interlayer dielectric film 104). The support portions 703 are formed to be higher than the movable beam driving electrodes 105a and 105b and the mirror driving electrodes 106a and 106b.

In this case, for example, even when the movable beam 182a receives a large electrostatic attraction and is attracted toward the electrode substrate 101, the movable beam extending portions 701 come into contact with the support portion 703, thereby preventing the movable beam 182a from coming into contact with the movable beam driving electrode 105a. This avoids the above-described problem of fusion or locking. Note that the potential of the use portion 703 is preferably the same as that of the mirror 183 and the movable beams 182a and 182b. For example, the potential is preferably the ground potential. The extending portions may be provided on one of the movable beam and the mirror.

Figure 8A:
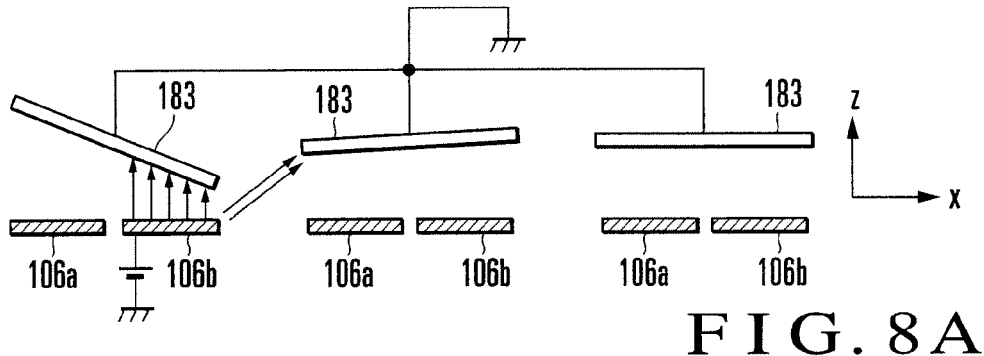
FIGS. 8A and 8B are schematic sectional views for explaining crosstalk.

Crosstalk generated when the mirror driving electrodes 106a and 106b drive the mirror 183 will be explained next. As described above, the micromirror devices are arrayed at a narrow interval. For this reason, an electrostatic attraction generated by the mirror driving electrode 106b of a given micromirror device affects not only the mirror 183 of the micromirror device of influence but also the mirror 183 of an adjacent micromirror device, as shown in the sectional view of FIG. 8A. That is, electrical interference (crosstalk) may occur between the adjacent mirrors 183.

Figure 8B:
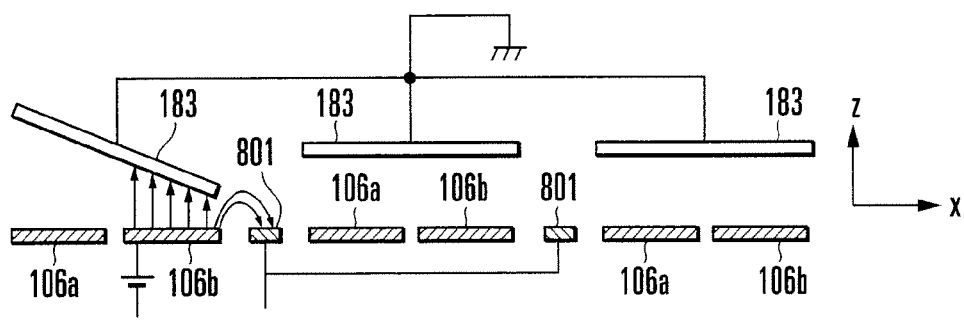

To solve the above problem, inter-device electrodes 801 set at the same potential (equipotential) as that of the mirrors 183 are provided between the mirror driving electrodes 106b and 106a of adjacent micromirror devices, as shown in the sectional view of FIG. 8B. The inter-device electrode 801 reduces the influence of crosstalk of the mirror driving electrodes 106a and 106b on the mirrors 183 of adjacent micromirror devices.

Figure 9A:
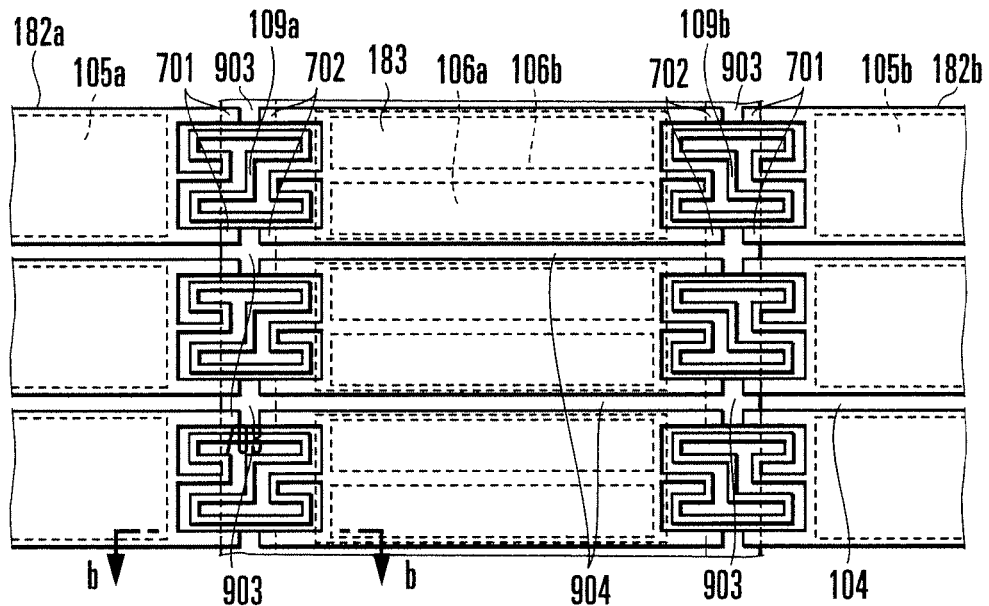
FIG. 9A is a plan view showing still another example of the arrangement of the micromirror devices (micromirror array) according to the first embodiment of the present invention.
Figure 9B:
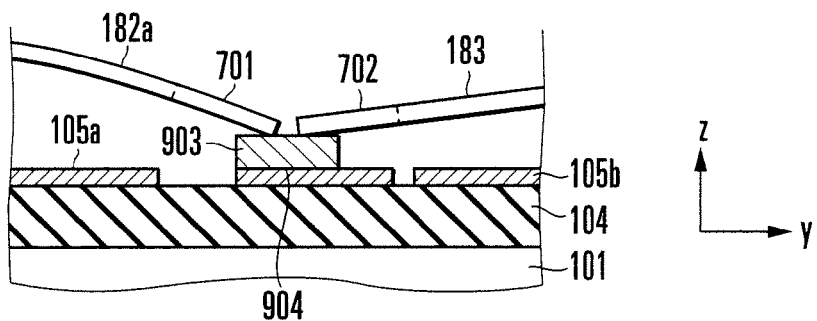
FIG. 9B is a partial sectional view showing still another example of the arrangement of the micromirror device (micromirror array) according to the first embodiment of the present invention.
Figure 9C:
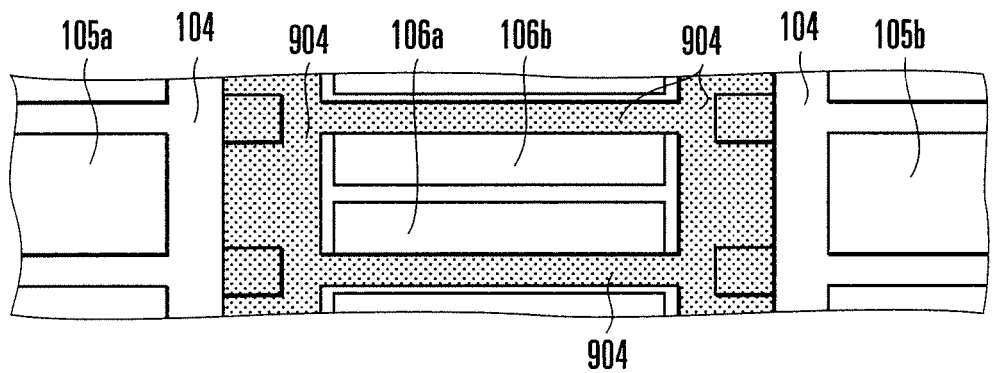
FIG. 9C is a plan view showing still another example of the arrangement of the micromirror devices (micromirror array) according to the first embodiment of the present invention.

An example of formation of the inter-device electrode to reduce the above-described influence of the crosstalk will be described next. For example, as shown in FIGS. 9A, 9B, and 9C, an inter-device electrode 904 is formed to surround the pair of mirror driving electrodes 106a and 106b of one micromirror device. When forming the inter-device electrode 904 in the above-described way, support portions 903 made of a conductive material such as a metal are connected to the inter-device electrode 904. This prevents charge accumulation in the support portions 903. Note that FIG. 9A is a plan view showing a portion where three micromirror devices are arrayed. FIG. 9B is a partial sectional view. FIG. 9C is a plan view showing a state in which the electrodes are formed in a region corresponding to almost one micromirror device.

Figure 10A:
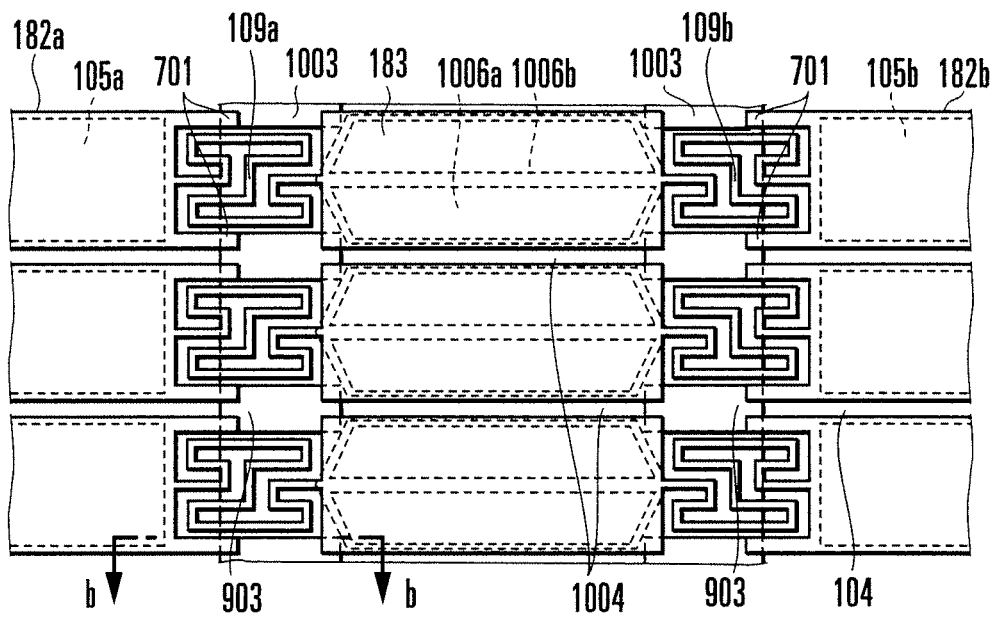
FIG. 10A is a plan view showing still another example of the arrangement of the micromirror devices (micromirror array) according to the first embodiment of the present invention.
Figure 10B:
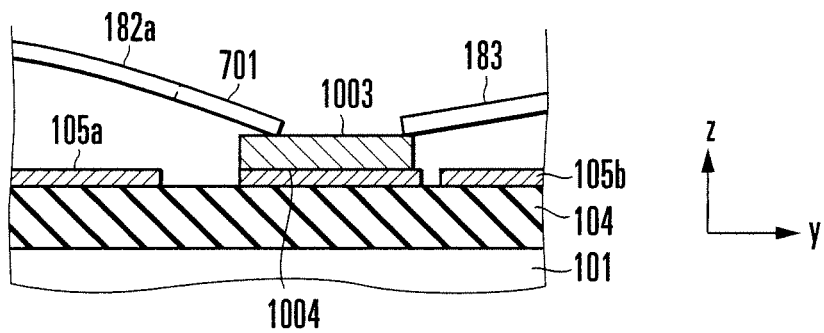
FIG. 10B is a partial sectional view showing still another example of the arrangement of the micromirror device (micromirror array) according to the first embodiment of the present invention.
Figure 10C:
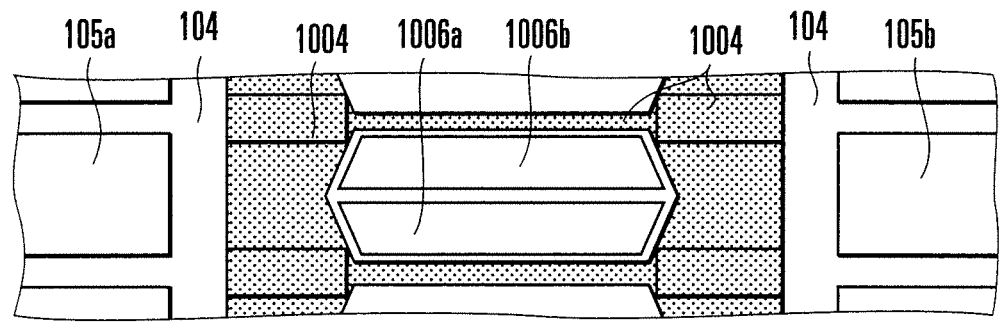
FIG. 10C is a plan view showing still another example of the arrangement of the micromirror devices (micromirror array) according to the first embodiment of the present invention.

Alternatively, as shown in FIGS. 10A, 10B, and 10C, out of the opposite sides of a micromirror device which are parallel when viewed from above, the outer sides may be shortened to obtain trapezoidal shapes. Mirror driving electrodes 1006a and 1006b may be formed into the trapezoidal shapes, and an inter-device electrode 1004 may be formed conforming to the electrode shape. In the example shown in FIGS. 10A, 10B, and 10C, the mirror driving electrodes 1006a and 1006b have an isosceles trapezoidal shape when viewed from above. Note that the mirror driving electrodes 1006a and 1006b need not always have the trapezoidal shape. It is only necessary to decrease the length in the first rotation axis direction outward (toward the adjacent micromirror devices) in the formation region of one micromirror device so that the inter-device electrode 1004 can enter more inward.

The mirror driving electrodes 1006a and 1006b having rounded corners on the outer sides of the micromirror device formation region (the sides of the adjacent micromirror devices) allow the inter-device electrode 1004 to further enter toward the mirror 183. Hence, support portions 1003 which further enter toward the mirror 183 can be formed. It is consequently possible to bring an end of the mirror 183 attracted toward the electrode substrate 101 into contact with the support portion 1003 without forming extending portions of the mirror 183. This solves the above-described problem of locking without forming extending portions of the mirror 183. Note that FIG. 10A is a plan view showing a portion where three micromirror devices are arrayed. FIG. 10B is a partial sectional view. FIG. 10C is a plan view showing a state in which the electrodes are formed in a region corresponding to almost one micromirror device.

Figure 11A:
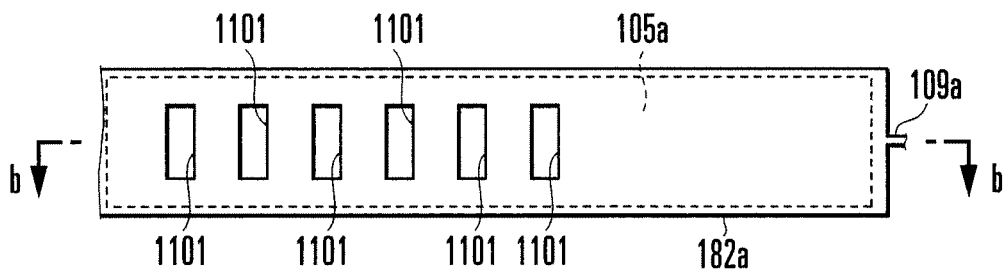
FIG. 11A is a plan view showing another example of the arrangement of the movable beam of the micromirror device (micromirror array) according to the first embodiment of the present invention.
Figure 11B:
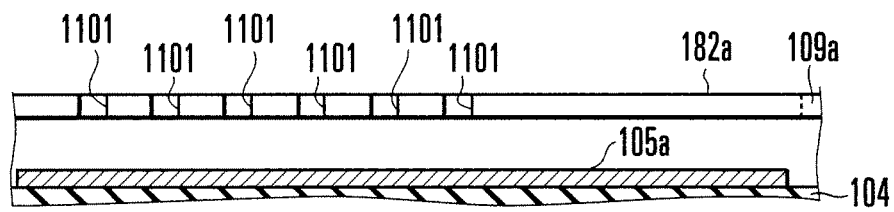
FIG. 11B is a plan view showing the other example of the arrangement of the movable beam of the micromirror device (micromirror array) according to the first embodiment of the present invention.

A movable beam in another form will be described next. For example, the movable beam 182a may have hole portions 1101, as shown in the plan view of FIG. 11A and the sectional view of FIG. 11B. Forming the hole portions 1101 enables to make the spring constant of the movable beam 182a smaller in the region having the hole portions 1101. When the spring constant is smaller, the same deformation amount (displacement amount) of the movable beam 182a can be obtained at a lower driving voltage as compared to a structure without hole portions. Note that this also applies to the movable beam 182b shown in FIGS. 1A, 1B, and 1C.

Figure 12A:
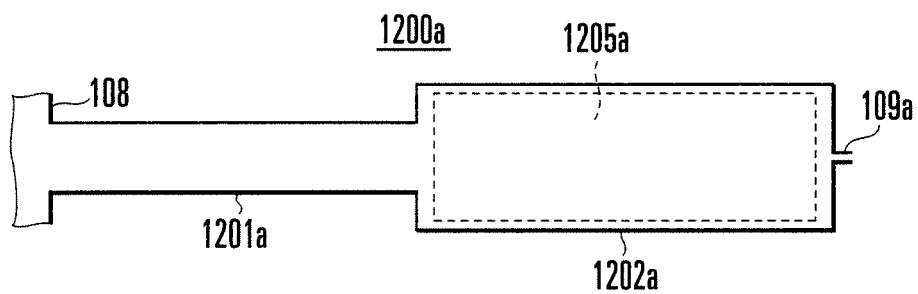
FIG. 12A is a plan view showing still another example of the arrangement of the movable beam of the micromirror device (micromirror array) according to the first embodiment of the present invention.
Figure 12B:
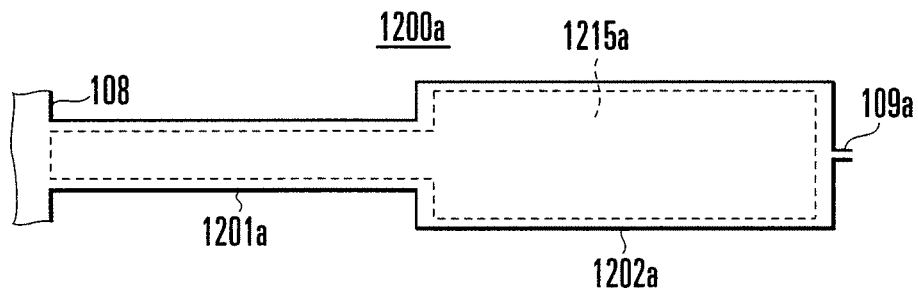
FIG. 12B is a plan view showing the still other example of the arrangement of the movable beam of the micromirror device (micromirror array) according to the first embodiment of the present invention.

Alternatively, a movable beam 1200a which is narrower on the side fixed to the mirror substrate 108, as shown in FIGS. 12A and 12B, may be used. The movable beam 1200a includes a beam portion 1201a narrower on the fixed end side, and a beam portion 1202a between the narrow beam portion 1201a and the connector 109a. Referring to FIG. 12A, a movable beam driving electrode 1205a is provided in correspondence with the region of the beam portion 1202a. Since the movable beam is narrower on the fixed end side, the spring constant is small. This allows to ensure the same deformation amount (displacement amount) of the movable beam 1200a at a lower driving voltage as compared to a structure without a narrow portion. It is therefore possible to obtain the same deformation amount using the movable beam driving electrode 1205a having a small area. Otherwise, a movable beam driving electrode 1215a corresponding to the entire region of the movable beam 1200a may be provided, as shown in FIG. 12B. In this case, the same deformation amount can be obtained at a lower driving voltage. Note that the above description also applies to the other movable beam facing the movable beam 1200a via a mirror.

[Second Embodiment]

Figure 13A:
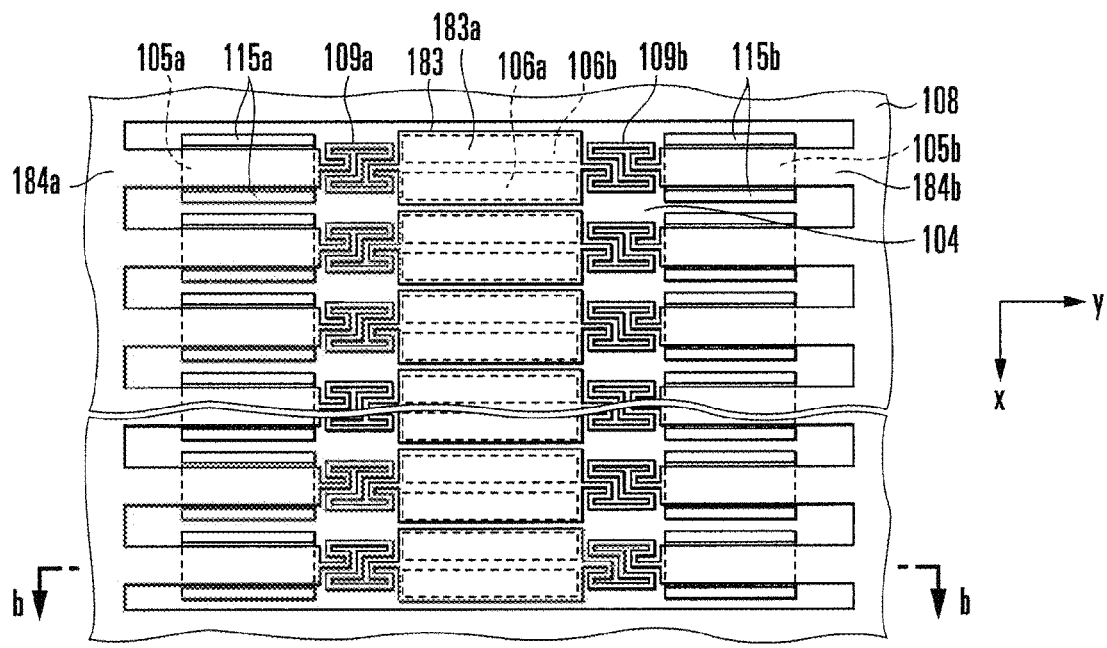
FIG. 13A is a plan view showing an example of the arrangement of micromirror devices (micromirror array) according to the second embodiment of the present invention.
Figure 13B:
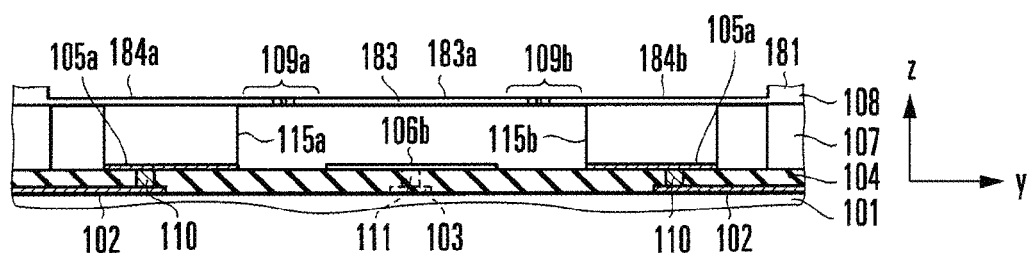
FIG. 13B is a sectional view showing an example of the arrangement of the micromirror device (micromirror array) according to the second embodiment of the present invention.
Figure 13C:
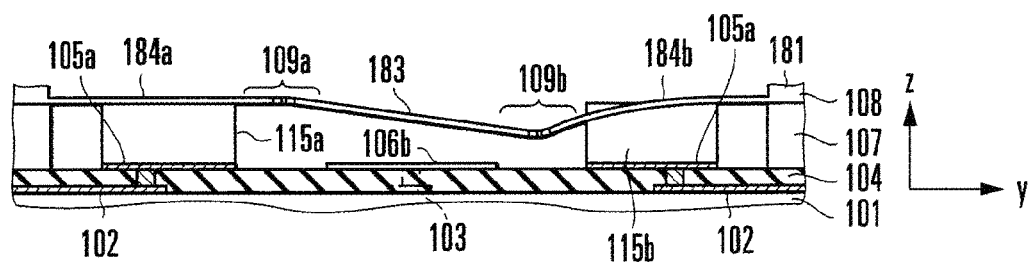
FIG. 13C is a sectional view showing an example of the arrangement of the micromirror device (micromirror array) according to the second embodiment of the present invention.

The second embodiment of the present invention will be described next with reference to FIGS. 13A to 13C and 14. FIG. 13A is a plan view showing an example of the arrangement of micromirror devices according to the second embodiment. FIGS. 13B and 13C are sectional views showing an example of the arrangement of the micromirror device according to the second embodiment. FIG. 13A illustrates a micromirror array formed by arraying a plurality of micromirror devices in the vertical direction (x direction) of the drawing surface.

As the characteristic feature of the micromirror device of the second embodiment, movable beam driving electrodes 105a and 105b have wall electrodes 115a and 115b, respectively. Two wall electrodes 115a are arranged spaced-apart through at least the region where a movable beam 184a displaces. Similarly, two wall electrodes 115b are arranged to spaced-apart through at least the region where a movable beam 184b displaces. The wall electrodes 115a are electrically connected to the movable beam driving electrode 105a. The wall electrodes 115b are electrically connected to the movable beam driving electrode 105b. Note that the wall electrodes 115a and 115b need not be in direct contact with the movable beam driving electrodes 105a and 105b. For example, they may be connected electrically via an electrical interconnection layer under an interlayer dielectric film 104.

The movable beam 184a facing each movable beam driving electrode 105a has a width in such a range that enables displacement toward the movable beam driving electrode 105a in the region which is surrounded by the wall electrodes 115a. Similarly, the movable beam 184b facing each movable beam driving electrode 105b has a width in such a range that enables displacement toward the movable beam driving electrode 105b in the region which is surrounded by the wall electrodes 115b. Hence, the movable beams 184a and 184b are formed to be narrower than, e.g., a mirror 183.

Note that the remaining components are the same as in the above-described first embodiment.

In the second embodiment, for example, the two wall electrodes 115a are connected to the two side portions of the movable beam driving electrode 105a in the direction (y-axis direction) in which the movable beam 184a, the mirror 183, and the movable beam 184b are arrayed. The wall electrodes 115a run in the y-axis direction. Hence, on a section in the micromirror device array direction, the movable beam driving electrode 105a and the two wall electrodes 115a form a U shape open toward the movable beam 184a. The movable beam 184a which is attracted upon applying a predetermined driving voltage to the movable beam driving electrode 105a enters between the two wall electrodes 115a. These also apply to the region of the movable beam driving electrode 105b.

The operation of the second embodiment is the same as in the above-described embodiment, as will be explained below. First, a predetermined driving voltage is applied to the movable beam driving electrode 105b to generate an electrostatic attraction and thus attract the movable beam 184b toward an electrode substrate 101.

The movable beam 184b deforms using its end supported by a frame portion 181 as a fulcrum so that the other end of the movable beam 184b displaces toward the electrode substrate 101, as shown in FIG. 13C. Consequently, the mirror 183 is attracted toward the electrode substrate 101 on the side of a connector 109b using a connector 109a as a fulcrum. The mirror 183 is not parallel to the electrode substrate 101 any longer but tilts in the y-axis direction. Note that FIG. 13B illustrates the initial state before voltage application to the electrodes.

In the state shown in FIG. 13C, the mirror 183 rotates about the second rotation axis which passes through the central portion of the mirror 183 and is parallel to the micromirror device array direction (x-axis direction). The above-described rotation about the second rotation axis is done while moving the second rotation axis in the z-axis direction. However, displacing the movable beams 184a and 184b to different sides in the z-axis direction allows the mirror 183 to rotate about the second rotation axis without moving it. For example, predetermined bias voltages are applied to the movable beam driving electrodes 105a and 105b, and then, the driving voltages applied to them are controlled, thereby displacing the movable beams 184a and 184b to different sides in the z-axis direction.

Figure 14:
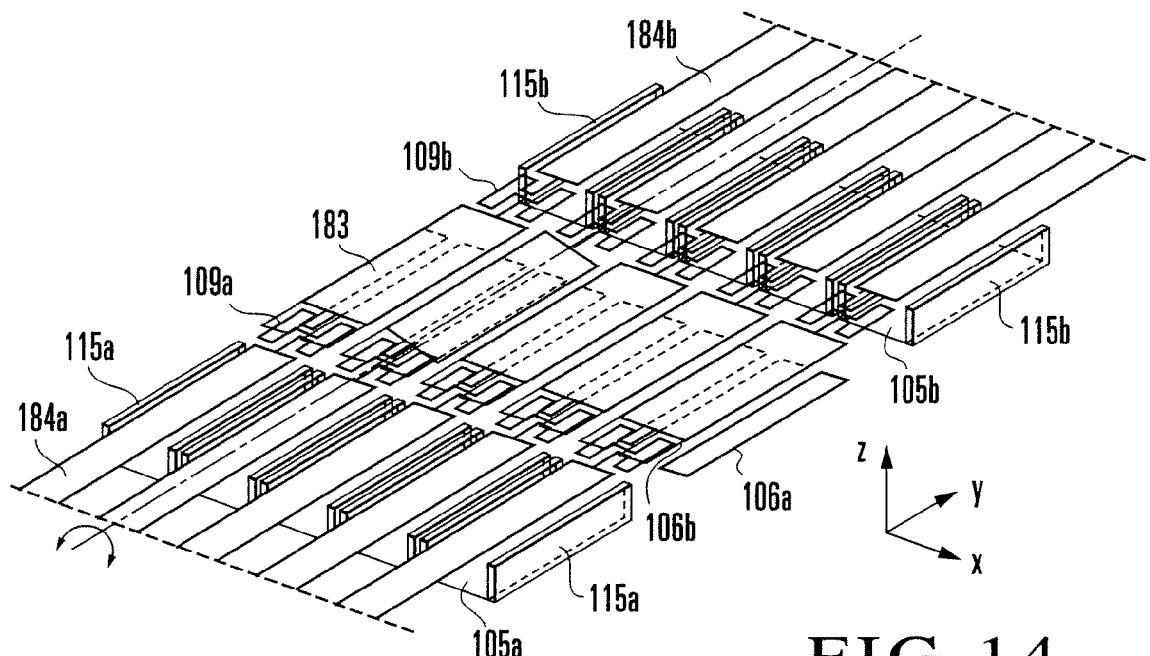
FIG. 14 is a perspective view showing an example of the arrangement of the micromirror devices (micromirror array) according to the second embodiment of the present invention.

Controlling voltages applied to mirror driving electrodes 106a and 106b enables the mirror 183 to rotate about the first rotation axis which passes through the pair of connectors 109a and 109b, as shown in the perspective view of FIG. 14. For example, a higher voltage is applied to the mirror driving electrode 106b relative to the mirror driving electrode 106a. This allows control to tilt the mirror 183 toward the mirror driving electrode 106b about the first rotation axis.

As described above, in the second embodiment as well, the two-axis rotation operation of the mirror 183 is possible, as in the above-described first embodiment. Additionally, in the second embodiment, the wall electrodes 115a and 115b suppress crosstalk to micromirror devices arranged adjacent, as will be explained below.

The wall electrodes 115a and 115b will be described below in more detail. Each micromirror device is arranged at a narrow interval with respect to adjacent micromirror devices. For this reason, if the movable beam driving electrode 105a is a simple parallel-plate electrode, the electrostatic attraction affects not only a movable beam 182 of the micromirror device of influence but also the movable beam 182 of an adjacent micromirror device and displaces its position. As a result, electrical interference (crosstalk) may occur between the adjacent mirrors 183.

Figure 15A:
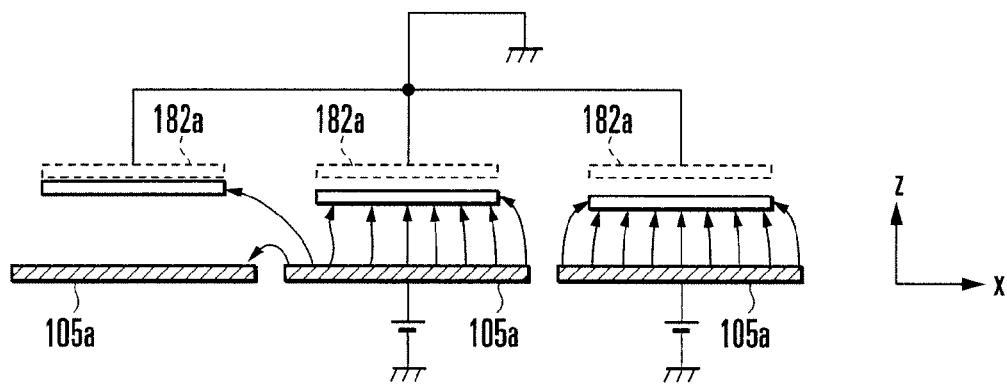
FIGS. 15A and 15B are schematic sectional views for explaining crosstalk.

For example, as shown in FIG. 15A, a driving voltage is applied not to the movable beam driving electrode 105a facing a movable beam 182a at the left end but to the movable beam driving electrode 105a facing the movable beam 182a at the center. In this case, the movable beam driving electrode 105a at the center sometimes electrically acts on the movable beam 182a at the left end so that the movable beam 182a at the left end is attracted toward the movable beam driving electrode 105a.

Figure 15B:
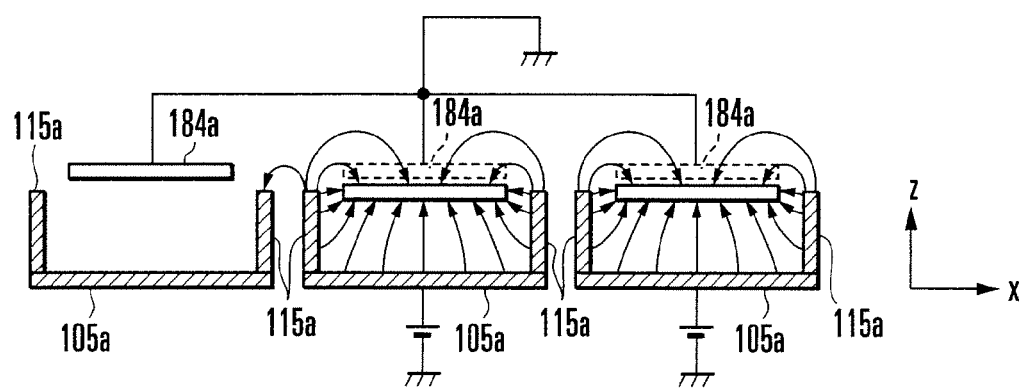

However, the wall electrodes 115a connected to each movable beam driving electrode 105a can separate the electric fields to drive the movable beams for each micromirror device, as shown in FIG. 15B. The wall electrodes 115a almost block the lines of electric force from the movable beam driving electrode 105a to the adjacent movable beams 184a, thereby suppressing the influence of crosstalk. Such crosstalk suppression is most effective when the height of the wall electrodes 115a and 115b almost matches the height-direction position of the movable beams 184a and 184b in the initial state.

The crosstalk suppression effect will be described next. In a micromirror array including three micromirror devices arrayed, the rotation state of the mirror of the micromirror device at the center when a driving voltage is applied to only the movable beam driving electrode of the micromirror device at the center (single driving) will be compared with that when a driving voltage is applied to the movable beam driving electrodes of the three micromirror devices (simultaneous driving). In either case, the same driving voltage is applied to the movable beam driving electrodes. Defining a case without the wall electrodes as condition 1 and a case using the wall electrodes as condition 2, the rotation state of the mirror is examined (compared), as described above.

Figure 16A:
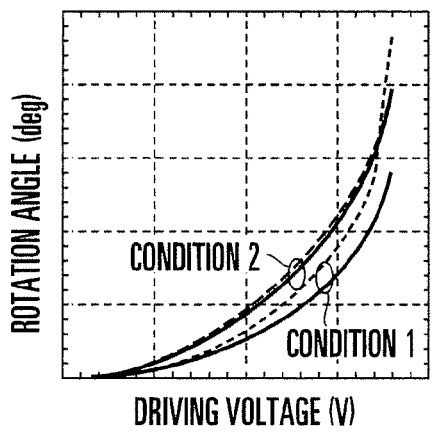
FIGS. 16A and 16B are graphs for explaining a crosstalk suppression effect.

As shown in FIG. 16A, the examination reveals that the rotation angle is larger in simultaneous driving (dotted line) than in single driving (solid line) at a higher driving voltage in condition 1. This is because each movable beam is attracted not only to the corresponding movable beam driving electrode but also to those of adjacent micromirror devices, and this largely displaces the movable beam and consequently increases the rotation angle of the mirror.

In condition 2, however, the rotation angle of the mirror rarely changes between single driving (solid line) and simultaneous driving (dotted line) even when the driving voltage rises. That is, the wall electrodes reduce the electrical interference from the movable beam driving electrodes of the adjacent micromirror devices to an almost negligible level. It is consequently possible to arrange the adjacent micromirror devices at a narrow interval and suppress crosstalk.

The wall electrodes also make it possible to control the rotation angle of the mirror more linearly with respect to the driving voltage, as will be explained below. Without the wall electrodes, the rotation angle (change rate) of the mirror abruptly increases when the driving voltage exceeds a predetermined level, as indicated by the dotted line in FIG. 16B. This is a pull-in phenomenon that abruptly increases the electrostatic attraction between the movable beam and the movable beam driving electrode and causes imbalance between it and the restoring force of the movable beam so that the movable beam collides with the movable beam electrode.

Figure 16B:
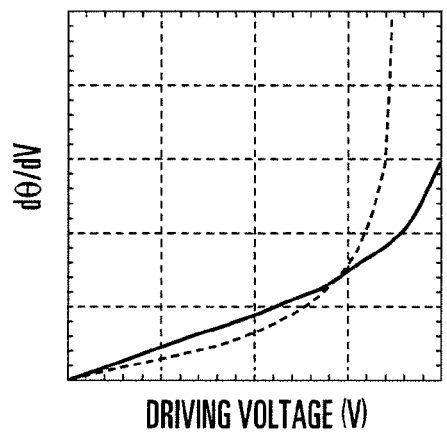

However, when the wall electrodes are used, no abrupt change occurs, as indicated by the solid line in FIG. 16B, even when the voltage for causing the abrupt change indicated by the dotted line is applied to the movable beam electrode. That is, no pull-in phenomenon takes place. Additionally, the linearity of the mirror rotation angle change rate with respect to the driving voltage improves.

This effect will be examined. Upon receiving the electrostatic attraction from the movable beam driving electrode 105a, the movable beam 184a displaces and moves into the region (trench) surrounded by the two wall electrodes 115a, as shown in FIG. 15B. In this state, an electrostatic attraction from the upper portions of the wall electrodes 115a also acts on the movable beam 184a and attracts it upward in the drawing. Such a force acts in a direction opposite to the direction in which the pull-in phenomenon occurs. This is supposed to suppress the pull-in phenomenon and improve the linearity of the change rate, resulting in higher controllability of the rotation angle (the position of the movable beam 184a).

Formation of the wall electrodes 115a and 115b will briefly be described next. First, the movable beam driving electrodes 105a and 105b having a plate structure are formed at desired positions of the electrode substrate 101 (single-crystal silicon substrate) which includes, on its surface, the electrical interconnection layer and the interlayer dielectric film 104 covering it. These electrodes can be formed by vapor-depositing or sputtering, e.g., gold using titanium as an underlayer. Alternatively, the electrodes may be formed by gold-plating using a thin gold film formed by vapor deposition or sputtering as a seed layer and a pattern of a resin film (resist) formed by a known lithography technique as a mold.

A resist pattern having openings corresponding to the desired regions of the movable beam driving electrodes 105a and 105b is formed. Using the resist pattern as a mold, the movable beam driving electrodes 105a and 105b are partially gold-plated. In this way, plated films are formed using parts of the movable beam driving electrodes 105a and 105b as a seed layer, thereby forming the wall electrodes 115a and 115b.

Figure 17A:
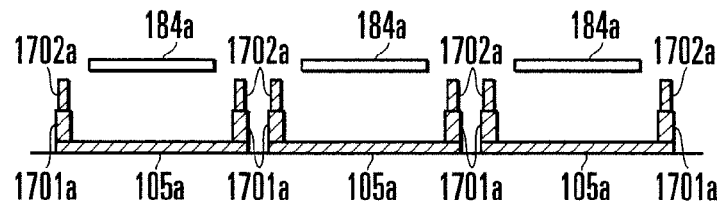
FIGS. 17A to 17C are sectional views showing other examples of the arrangement of electrode walls of the micromirror device (micromirror array) according to the second embodiment of the present invention.

For example, each wall electrode may have a multistage structure including a lower wall electrode 1701*a* and an upper wall electrode 1702*a*, as shown in FIG. 17A. This structure facilitates formation of higher wall electrodes.

Figure 17B:
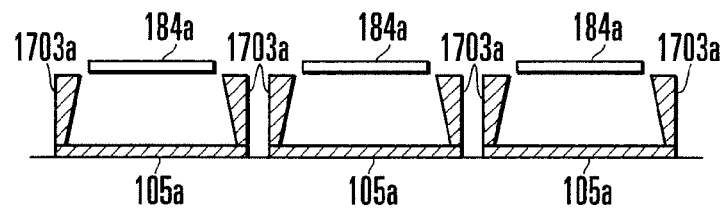
Figure 17C:
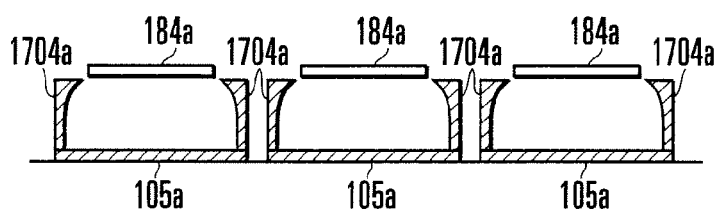
Figure 18:
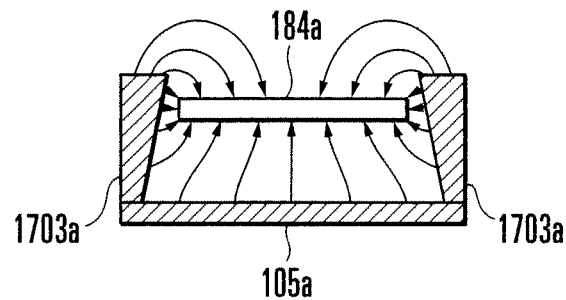
FIG. 18 is a sectional view for explaining the effect of another electrode wall of the micromirror device (micromirror array) according to the second embodiment of the present invention.

Also usable are wall electrodes 1703*a* or 1704*a* whose thickness changes in the height direction, as shown in FIGS. 17B and 17C. The wall electrodes 1703*a* which inwardly increase the thickness toward the ends opposite to the movable beam driving electrode 105*a* can apply a stronger electrostatic attraction from their upper end portions to the upper surface of the movable beam 184*a*, as shown in the schematic sectional view of FIG. 18. This yields a stronger force to bring back the movable beam 184*a* displaced downward, and enhances the effect of "improving the controllability of the movable beam" or "suppressing the pull-in phenomenon".

The movable beam driving electrode and the wall electrodes need not always be arranged in correspondence with the entire region of the movable beam. They may be arranged on a region nearer to the movable end of the movable beam. The movable beam has a cantilever structure. The electrostatic attraction applied to the movable end most largely influences the displacement of the movable end. For this reason, the movable beam driving electrode and the wall electrodes may partially be arranged in a region closer to the movable end.

Figure 19A:
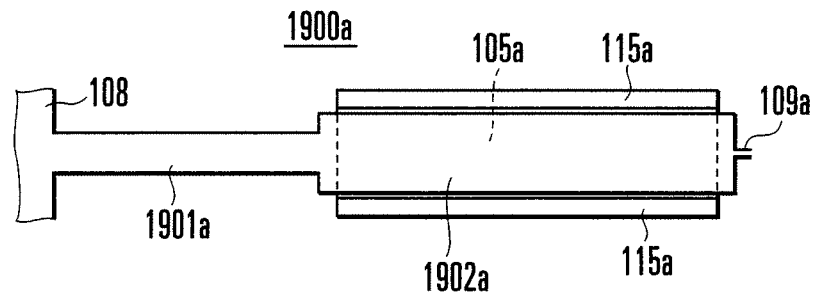
FIG. 19A is a plan view showing another example of the arrangement of the movable beam of the micromirror device (micromirror array) according to the second embodiment of the present invention.
Figure 19B:
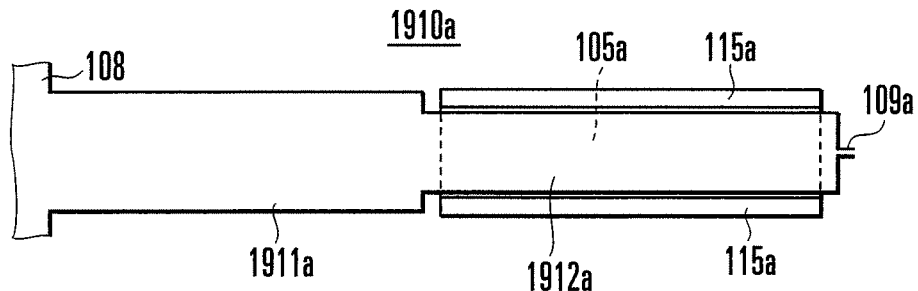
FIG. 19B is a plan view showing still another example of the arrangement of the movable beam of the micromirror device (micromirror array) according to the second embodiment of the present invention.

In this case, as shown in the plan view of FIG. 19A, a movable beam 1900*a* may include a narrower support side portion 1901*a* and a wider movable end side portion 1902*a*, and the movable beam driving electrode 105*a* and the wall electrodes 115*a* may be formed to face the movable end side portion 1902*a*. Alternatively, as shown in the plan view of FIG. 19B, a movable beam 1910*a* may include a wider support side portion 1911*a* and a narrower movable end side portion 1912*a*, and the movable beam driving electrode 105*a* and the wall electrodes 115*a* may be formed to face the movable end side portion 1912*a*. Changing the width of the movable beam between the support side portion and the movable end side portion enables to design the spring constant of the movable beam to an arbitrary value.

[Third Embodiment]

Figure 20:
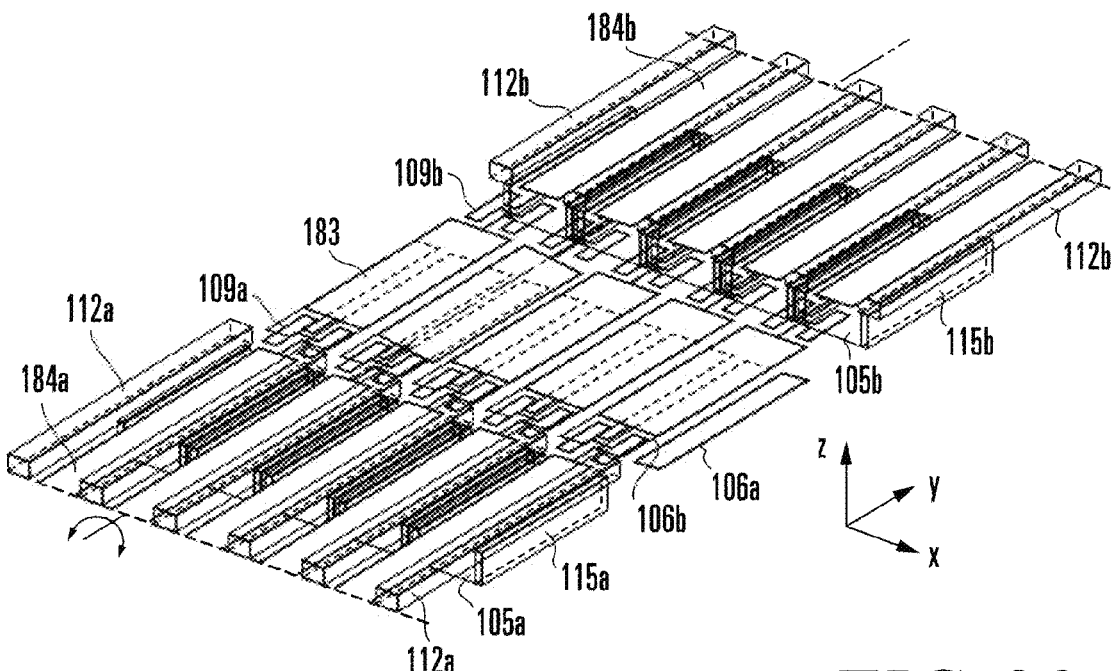
FIG. 20 is a perspective view showing an example of the arrangement of micromirror devices (micromirror array) according to the third embodiment of the present invention.
Figure 21:
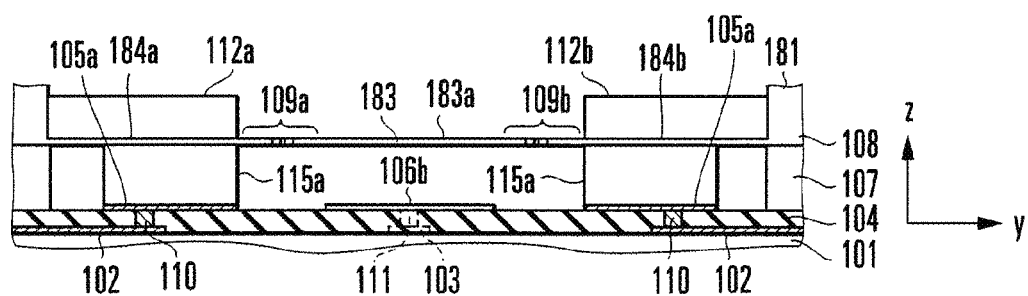
FIG. 21 is a sectional view showing an example of the arrangement of the micromirror device (micromirror array) according to the third embodiment of the present invention.
Figure 22:
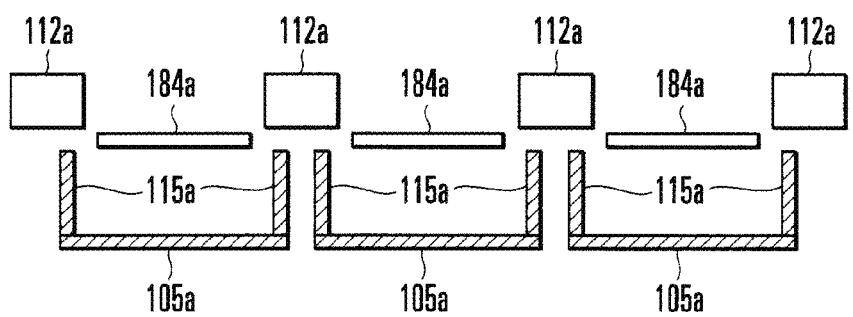
FIG. 22 is a sectional view showing an example of the arrangement of the micromirror devices (micromirror array) according to the third embodiment of the present invention.

The third embodiment of the present invention will be described next with reference to FIGS. 20, 21, and 22. A repetitive description of the same parts as in the above-described embodiments will be omitted as needed. FIG. 20 is a perspective view showing the arrangement of micromirror devices according to the third embodiment and a micromirror array formed by arraying them. FIG. 20 illustrates a state in which a plurality of micromirror devices are arrayed in a direction (x-axis direction) perpendicular to the direction (y-axis direction) in which two movable beams and a mirror are arrayed. FIG. 21 is a sectional view showing a section taken along the direction in which the two movable beams and the mirror are arrayed. FIG. 22 is a sectional view showing a section taken along the direction in which the micromirror devices are arrayed.

In the third embodiment, upper inter-device electrodes 112*a* and 112*b* are provided between adjacent micromirror devices on the upper side of movable beams 184*a* and 184*b* so as to be spaced apart from the movable beams 184*a* and 184*b*, in addition to the above-described second embodiment. The upper inter-device electrodes 112*a* and 112*b* are commonly arranged above adjacent wall electrodes 115*a* and 115*b* and spaced apart from them. The upper inter-device electrodes 112*a* and 112*b* are set at the same potential (ground potential) as that of, e.g., the movable beams 184*a* and 184*b*. Note that the upper inter-device electrodes 112*a* and 112*b* are used to block leakage fields from the wall electrodes 115*a* and 115*b* and need not be set at the same potential as that of the movable beams 184*a* and 184*b*.

That is, the third embodiment using the upper inter-device electrodes 112*a* and 112*b* ensures better isolation between the elements, as will be described later. More specifically, the wall electrodes 115*a* and 115*b* separate electric fields to drive the movable beams 184*a* and 184*b* for each micromirror device, as described above. However, the electric fields can leak even from the upper portions of the wall electrodes 115*a* and 115*b* used for isolation, though the leakage amount is small, and act on the adjacent movable beams 184*a* and 184*b* or adjacent movable beam driving electrodes 105*a* and 105*b*.

The upper inter-device electrodes 112*a* and 112*b* are arranged to block the leakage fields from the upper portions of the wall electrodes 115*a* and 115*b*. As shown in FIG. 23, the upper inter-device electrodes 112*a* set at the same potential as that of the movable beams 184*a* completely block the lines of electric force leaking from the upper portions of the wall electrodes 115*a*, thereby further suppressing the influence of crosstalk between the adjacent elements. The crosstalk suppression effect can be enhanced by arranging the upper ends of the wall electrodes 115*a* and 115*b* and the upper inter-device electrodes 112*a* and 112*b* in a closer range.

The manufacture of the upper inter-device electrodes 112*a* and 112*b* will briefly be described. The upper inter-device electrodes 112*a* and 112*b* are obtained by, for example, forming the movable beams 184*a* and 184*b* from the SOI layer of an SOI substrate and the upper inter-device electrodes 112*a* and 112*b* from the silicon substrate portion of the SOI substrate. For example, the upper inter-device electrodes and the movable beams (mirrors) are formed in the substrate portion and the SOI layer arranged via a buried insulating layer, and then, the buried insulating layer is removed. The upper inter-device electrodes and the movable beams can be set at the same potential by electrically connecting the SOI layer and the substrate portion in a region outside the elements.

The above-described upper inter-device electrodes may be formed in the same mirror substrate as that for the movable beams. To form the mirrors and the movable beams, openings are formed in the mirror substrate in correspondence with the regions where the micromirror devices will be arranged. Regions adjacent to the opening regions may be formed into the upper inter-device electrodes. This formation method makes it possible to form the upper inter-device electrodes simultaneously with the mirrors and the movable beams. In this case, the upper inter-device electrodes are integrally formed as the mirror substrate.

For example, an integrated upper inter-device electrode 113*a* or 114*a* may be provided in correspondence with a plurality of micromirror devices, as shown in FIGS. 24 and 25. In these cases, the upper inter-device electrode is arranged above the movable beams 184*a* (movable beams 184*b*) as well. The upper inter-device electrode is preferably spaced apart from the movable beams but arranged close to the upper portions of the wall electrodes. For this purpose, the upper inter-device electrode 114*a* shown in FIG. 25 is spaced farther from the movable beams 184*a* by forming trench portions 141*a* facing them and brought closer to the wall electrodes 115*a* by forming ridge portions 143*a* facing them.

To form such an integrated upper inter-device electrode, for example, another substrate having the upper inter-device electrode is formed independently of a mirror substrate 108, and the other substrate is bonded to the mirror substrate. The ground potential may be connected to set the upper inter-device electrodes, the mirrors, and the movable beams at an equipotential. Integrally forming the upper inter-device electrodes (first upper inter-device electrodes and second upper inter-device electrodes) as described above, for example, facilitates alignment to the movable beams or the wall electrodes, resulting in easier manufacturing.

To reduce crosstalk between adjacent micromirror devices, it is effective to form inter-device electrode walls 2601 at the same potential (equipotential) as that of mirrors 183 between mirror driving electrodes 106b and 106a of adjacent micromirror devices, as shown in FIG. 26. The inter-device electrode wall 2601 is a structure formed by making the inter-device electrode 801 described with reference to FIG. 8B higher than the mirror driving electrodes 106a and 106b. As compared to the inter-device electrode 801, the inter-device electrode walls 2601 can further reduce the influence of the mirror driving electrodes of adjacent micromirror devices. The inter-device electrode wall 2601 which has a height almost ½ the distance between the mirror and the mirror driving electrode can most effectively reduce crosstalk in the mirror portion between the micromirror devices.

Figure 27A:
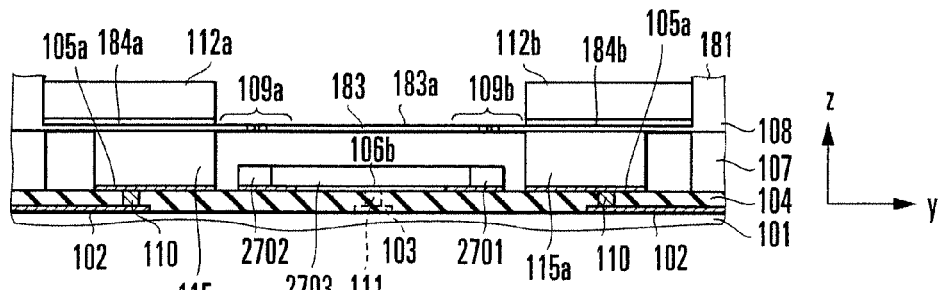
FIG. 27A is a sectional view showing another example of the arrangement of the micromirror device (micromirror array) according to the third embodiment of the present invention.
Figure 27B:
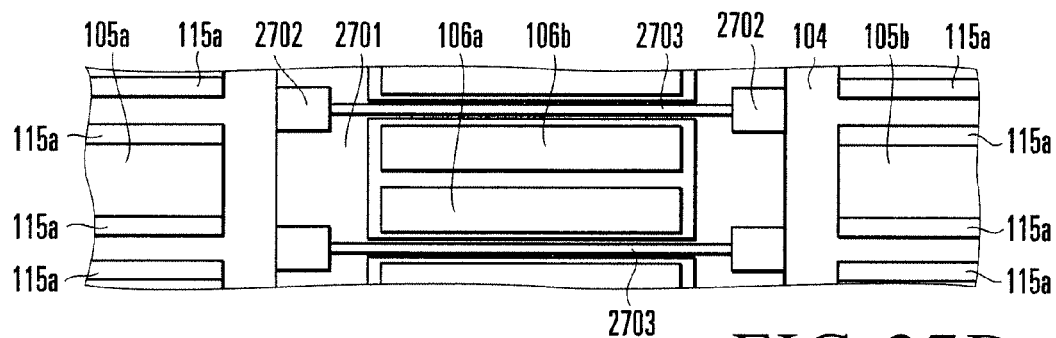
FIG. 27B is a plan view showing another example of the arrangement of the micromirror device (micromirror array) according to the third embodiment of the present invention.

An example of formation of the inter-device electrode walls to reduce the above-described influence of crosstalk will be explained next. For example, an electrical interconnection portion 2701 which surrounds the pair of mirror driving electrodes 106a and 106b of one micromirror device is provided, as shown in FIGS. 27A and 27B. Inter-device electrode walls 2703 connected to the electrical interconnection portion 2701 are formed between the mirror driving electrodes 106a and 106b of adjacent micromirror devices.

When forming the inter-device electrode walls 2703 in the above-described way, support portions 2702 made of a conductive material such as a metal are connected to the inter-device electrode walls 2703. This prevents charge accumulation in the support portions 2702. Note that FIG. 27A is a partial sectional view showing a portion where three micromirror devices are arrayed. FIG. 27B is a plan view showing a state in which the electrodes are formed in a region corresponding to almost one micromirror device.

Figure 28A:
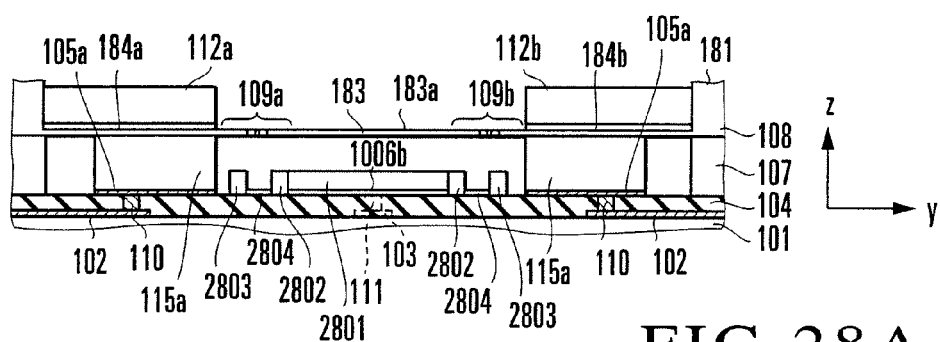
FIG. 28A is a sectional view showing another example of the arrangement of the micromirror device (micromirror array) according to the third embodiment of the present invention.
Figure 28B:
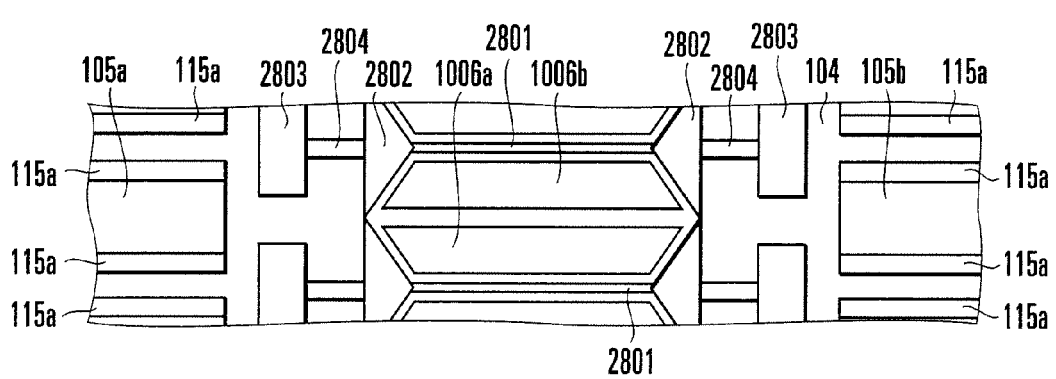
FIG. 28B is a plan view showing another example of the arrangement of the micromirror device (micromirror array) according to the third embodiment of the present invention.
Figure 29:
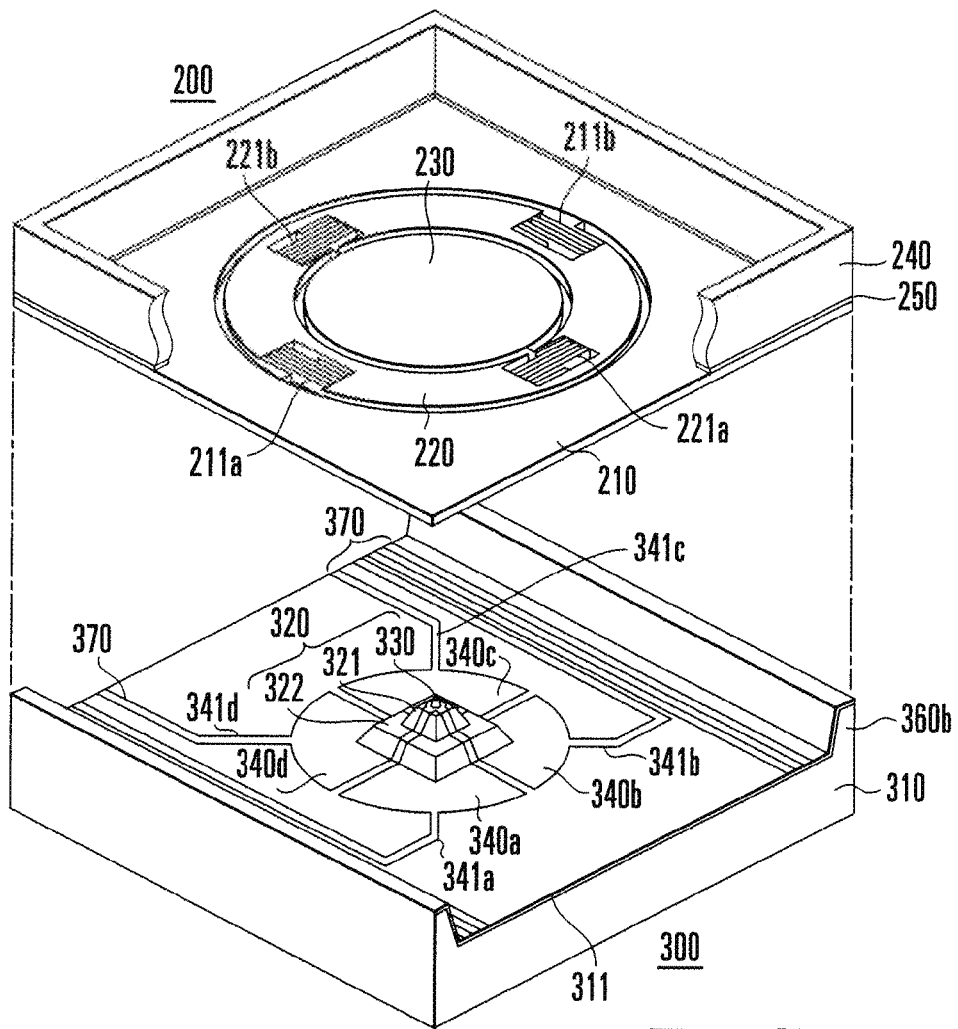
FIG. 29 is a perspective view showing the arrangement of a conventional micromirror device (micromirror array)
Figure 30:
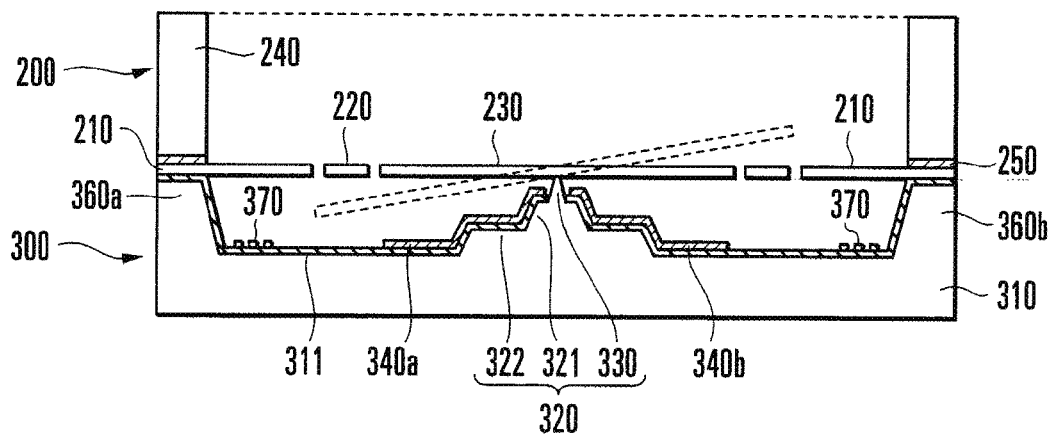
FIG. 30 is a sectional view showing the arrangement of the conventional micromirror device (micromirror array)

Alternatively, as shown in FIGS. 28A and 28B, inter-device electrode walls 2801 may be formed between mirror driving electrodes 1006a and 1006b of adjacent micromirror devices as described above. Mirror support portions 2802 may be formed along the outlines of the mirror driving electrodes 1006a and 1006b each having a trapezoidal shape. Additionally, movable beam support portions 2803 may be formed separately from the mirror support portions 2802. The mirror support portions 2802 are connected to the inter-device electrode walls 2801. The movable beam support portions 2803 are connected to the mirror support portions 2802 via electrical interconnections 2804.

The mirror driving electrodes 1006a and 1006b having rounded corners on the outer sides of the micromirror device formation region (the sides of the adjacent micromirror devices) allow the inter-device electrode walls 1004 to further enter toward the mirror 183. Hence, the mirror support portions 2802 which further enter toward the mirror 183 can be formed. It is consequently possible to bring an end of the mirror 183 attracted toward the electrode substrate 101 into contact with the mirror support portion 2802 without forming extending portions of the mirror 183.

Since the movable beam support portions 2803 are formed independently of the mirror support portions 2802, the movable beam support portions 2803 can be formed in accordance with the positions of the movable beams. It is consequently possible to bring an end of the movable beam 184a or 184b into contact with the movable beam support portion 2803 without forming extending portions of the movable beams 184a and 184b. Note that FIG. 28A is a partial sectional view of the micromirror device, and FIG. 28B is a plan view showing a state in which the electrodes are formed in a region corresponding to almost one micromirror device.

Industrial Applicability

The present invention is suitably used for an optical switching device for communication, a measuring device, a display, a scanner, a wavelength selective switch, or the like.

The invention claimed is:

1. A micromirror device comprising a reflecting portion and an electrode portion facing the reflecting portion,
    said reflecting portion comprising at least:
    a first plate-shaped movable beam and a second plate-shaped movable beam each having one end fixed and the other end displaceable, said first movable beam and said second movable beam being arranged in a line at a predetermined distance while said other end of said first movable beam faces said other end of said second movable beam;
    a plate-shaped mirror which is arrayed in a line with said first movable beam and said second movable beam and rotationally arranged between said first movable beam and said second movable beam; and
    a pair of a first connector and a second connector each of which connects said other end of a corresponding one of said first movable beam and said second movable beam to said mirror, and said electrode portion comprising at least:
    a first driving electrode for said first movable beam which faces said first movable beam at a predetermined distance;
    a second driving electrode for said second movable beam which faces said second movable beam at a predetermined distance;
    mirror driving electrodes which face said plate-shaped mirror at a predetermined distance;
    wherein said first movable beam and said first driving electrode for said first movable beam are arranged face to face in a thickness direction of said first movable beam, said first movable beam completely overlaps said first driving electrode, and said displaceable end of said first movable beam is displaced to be attracted toward said first driving electrode for said first movable beam;
    said second movable beam and said second driving electrode for said second movable beam are arranged face to face in a thickness direction of said second movable beam and said first movable beam completely overlaps said first driving electrode; and
    said displaceable end of said second movable beam is displaced to be attracted toward a facing surface of said second driving electrode for said second movable beam.

2. A micromirror device according to claim 1, further comprising:
    two first wall electrodes which are arranged spaced-apart through at least a region where said first movable beam is attracted to said first driving electrode; and
    two second wall electrodes which are arranged spaced-apart through at least a region where said second movable beam is attracted to said second driving electrode.

3. A micromirror device according to claim 2, wherein said first driving electrode and said two first wall electrodes form a U-shape opening toward the first movable beam on a section in an arrangement direction of said two first wall electrodes, and
    said second driving electrode and said two second wall electrodes form a U-shape opening toward the second movable beam on a section in an arrangement direction of said two second wall electrodes.

4. A micromirror device according to claim 1, wherein
said first movable beam, said first connector, said mirror, said second connector, and said second movable beam are arrayed in an order named on a rotation axis passing through said first connector, and said second connector,
said mirror is configured to rotate about the rotation axis, and
said other end of said first movable beam and said other end of said second movable beam are configured to displace in a direction of said electrode portion.

5. A micromirror device according to claim 1, wherein said mirror driving electrode include a pair of a first mirror driving electrode and a second mirror driving electrode, which is formed to be linearly symmetric with respect to the rotation axis.

6. A micromirror device according to claim 5, wherein said first mirror driving electrode and said second mirror driving electrode are formed to be shorter outwardly in a direction of the rotation axis within a formation region of one set of micromirror devices.

7. A micromirror device according to claim 1, wherein each of said first connector and said second connector has a plurality of bending portions which are formed such that a total length of parts parallel to the rotation axis becomes longer than an interval between the connectors in a no-load state.

8. A micromirror device according to claim 7, wherein each of said first connector and said second connector is formed into a nearly H-like shape when viewed from above.

9. A micromirror device according to claim 1, wherein said mirror has a planar shape that becomes narrower toward said first connector and said second connector.

10. A micromirror device according to claim 1, wherein said mirror has an elliptic planar shape with a major axis arranged on the rotation axis.

11. A micromirror device according to claim 1, wherein each of said first movable beam and said second movable beam has hole portions.

12. A micromirror device according to claim 1, wherein each of said first movable beam and said second movable beam includes a beam portion on a side of said one end and a beam portion on a side of said other end, and a width of the beam portion on the side of said one end is different from a width of the beam portion on the side of said other end.

13. A micromirror device according to claim 1, further comprising:
movable beam extending portions each of which extends, on a side of said mirror, from a corresponding one of said first movable beam and said second movable beam so as to surround a corresponding one of said first connector and said second connector; and
support portions each of which is arranged on said electrode portion facing an end portion of extension of a corresponding one of said movable beam extending portions.

14. A micromirror device according to claim 13, further comprising mirror extending portions each of which extends, on a side of a corresponding one of said first movable beam and said second movable beam, from said mirror so as to surround a corresponding one of said first connector and said second connector,
wherein each of said support portions is arranged on said electrode portion facing the end portion of the extension of a corresponding one of said movable beam extending portions and an end portion of extension of a corresponding one of said mirror extending portions.

15. A micromirror device according to claim 1, further comprising:
mirror extending portions each of which extends, on a side of a corresponding one of said first movable beam and said second movable beam, from said mirror so as to surround a corresponding one of said first connector and said second connector; and
support portions each of which is arranged on said electrode portion facing an end portion of extension of a corresponding one of said mirror extending portions.

16. A micromirror device according to claim 1, further comprising support portions each of which is arranged on said electrode portion facing an end portion of a corresponding of said first movable beam and said second movable beam on a side of said mirror and an end portion of said mirror on a side of a corresponding one of said first movable beam and said second movable beam.

17. The micromirror device according to claim 1, wherein
another end of said first movable beam is displaced so as to be pulled to said first driving electrode by a static pulling force generated at said first driving electrode, and
another end of said second movable beam is displaced so as to be pulled to said second driving electrode by a static pulling force generated at said second driving electrode.

18. A micromirror array including a plurality of micromirror devices arrayed,
said micromirror device comprising a reflecting portion and an electrode portion facing the reflecting portion,
said reflecting portion comprising at least:
a first plate-shaped movable beam and a second plate-shaped movable beam each having one end fixed and the other end displaceable, said first movable beam and said second movable beam being arranged in a line at a predetermined distance while said other end of said first movable beam faces said other end of said second movable beam;
said other end of said first movable beam is displaced to be attracted toward said first driving electrode, and said first movable beam and said first driving electrode face each other in a direction of the displacement of said other end of said first movable beam;
said other end of said second movable beam is displaced to be attracted toward said second driving electrode, and said second movable beam and said second driving electrode face each other in a direction of the displacement of said other end of said second movable beam;
a plate-shaped mirror which is arrayed in a line with said first movable beam and said second movable beam and rotationally arranged between said first movable beam and said second movable beam; and
a pair of a first connector and a second connector each of which connects said other end of a corresponding one of said first movable beam and said second movable beam to said plate-shaped mirror;
said electrode portion comprising at least:
a first driving electrode for said first movable beam which faces said first movable beam at a predetermined distance;
a second driving electrode for said second movable beam which faces said second movable beam at a predetermined distance;
mirror driving electrodes which face said plate-shaped mirror at a predetermined distance;
said micromirror devices being arrayed along a direction perpendicular to an array direction of said first movable beam and said second movable beam;

wherein said first movable beam and said first driving electrode for said first movable beam are arranged face to face in a thickness direction of said first movable beam, said first movable beam completely overlaps said first driving electrode, and said displaceable end of said first movable beam is displaced to be attracted toward a facing surface of said first driving electrode for said first movable beam;

said second movable beam and said second driving electrode for said second movable beam are arranged face to face in a thickness direction of said second movable beam and said second movable beam completely overlaps said second driving electrode; and said displaceable end of said second movable beam is displaced to be attracted toward a facing surface of said second driving electrode for said second movable beam.

19. A micromirror array according to claim 18, further comprising:
two first wall electrodes which are arranged spaced-apart through at least a region where said first movable beam displaces and electrically connected to said driving electrode for first movable beam; and
two second wall electrodes which are arranged spaced-apart through at least a region where said second movable beam displaces and electrically connected to said driving electrode for second movable beam.

20. A micromirror array according to claim 19, further comprising a first upper inter-device electrode and a second upper inter-device electrode which are provided, between adjacent micromirror devices, on an upper side of said first movable beam and said second movable beam between said adjacent micromirror devices so as to be spaced apart from said first movable beam and said second movable beam.

21. A micromirror array according to claim 20, wherein said first upper inter-device electrode and said second upper inter-device electrode are formed integrally.

22. A micromirror array according to claim 18, wherein said first movable beam, said first connector, said mirror, said second connector, and said second movable beam are arrayed in an order named on a rotation axis passing through said first connector and said second connector,
said mirror is configured to rotate about the rotation axis, and said other end of said first movable beam and said other end of said second movable beam are configured to displace in a direction of said electrode portion.

23. A micromirror array according to claim 18, wherein said mirror driving electrodes include a pair of a first mirror driving electrode and a second mirror driving electrode, which is formed to be linearly symmetric with respect to the rotation axis.

24. A micromirror array according to claim 23, wherein said first mirror driving electrode and said second mirror driving electrode are formed to be shorter outwardly in a direction of the rotation axis within a formation region of one set of micromirror devices.

25. A micromirror array according to claim 18, wherein each of said first connector and said second connector has a plurality of bending portions which are formed such that a total length of parts parallel to the rotation axis becomes longer than an interval between the connectors in a no-load state.

26. A micromirror array according to claim 25, wherein each of said first connector and said second connector is formed into a nearly H-like shape when viewed from above.

27. A micromirror array according to claim 18, wherein said mirror has a planar shape that becomes narrower toward said first connector and said second connector.

28. A micromirror array according to claim 18, wherein said mirror has an elliptic planar shape with a major axis arranged on the rotation axis.

29. A micromirror array according to claim 18, wherein each of said first movable beam and said second movable beam has hole portions.

30. A micromirror array according to claim 18, wherein each of said first movable beam and said second movable beam includes a beam portion on a side of said one end and a beam portion on a side of said other end, and a width of the beam portion on the side of said one end is different from a width of the beam portion on the side of said other end.

31. A micromirror array according to claim 18, further comprising:
movable beam extending portions each of which extends, on a side of said mirror, from a corresponding one of said first movable beam and said second movable beam so as to surround a corresponding one of said first connector and said second connector; and
support portions each of which is arranged on said electrode portion facing an end portion of extension of a corresponding one of said movable beam extending portions.

32. A micromirror array according to claim 31, further comprising mirror extending portions each of which extends, on a side of a corresponding one of said first movable beam and said second movable beam, from said mirror so as to surround a corresponding one of said first connector and said second connector,
wherein each of said support portions is arranged on said electrode portion facing the end portion of the extension of a corresponding one of said movable beam extending portions and an end portion of extension of a corresponding one of said mirror extending portions.

33. A micromirror array according to claim 18, further comprising:
mirror extending portions each of which extends, on a side of a corresponding one of said first movable beam and said second movable beam, from said mirror so as to surround a corresponding one of said first connector and said second connector; and
support portions each of which is arranged on said electrode portion facing an end portion of extension of a corresponding one of said mirror extending portions.

34. A micromirror array according to claim 18, further comprising an inter-device electrode which is arranged between said first mirror driving electrode and said second mirror driving electrode of adjacent electrode portions and set at an equipotential to said mirror.

35. A micromirror array according to claim 34, wherein said inter-device electrode is formed to be higher than said mirror driving electrodes.

36. A micromirror array according to claim 34, further comprising:
movable beam extending portions each of which extends, on a side of said mirror, from a corresponding one of said first movable beam and said second movable beam so as to surround a corresponding one of said first connector and said second connector; and
support portions each of which is arranged on said electrode portion facing an end portion of extension of a corresponding one of said movable beam extending portions and electrically connected to said inter-device electrode.

37. A micromirror array according to claim 36, further comprising mirror extending portions each of which extends, on a side of a corresponding one of said first movable beam and said second movable beam, from said mirror so as to surround a corresponding one of said first connector and said second connector,
  wherein each of said support portions is arranged on said electrode portion facing the end portion of the extension of a corresponding one of said movable beam extending portions and an end portion of extension of a corresponding one of said mirror extending portions.

38. A micromirror array according to claim 18, further comprising support portions each of which is arranged on said electrode portion facing an end portion of a corresponding one of said first movable beam and said second movable beam on a side of said mirror and an end portion of said mirror on a side of a corresponding one of said first movable beam and said second movable beam.

39. The micromirror array according to claim 18, wherein
  another end of said first movable beam is displaced so as to be pulled to said first driving electrode by a static pulling force generated at said first driving electrode, and
  another end of said second movable beam is displaced so as to be pulled to said second driving electrode by a static pulling force generated at said second driving electrode.

* * * * *